(12) United States Patent
Abdoli et al.

(10) Patent No.: US 11,832,274 B2
(45) Date of Patent: Nov. 28, 2023

(54) SYSTEMS AND METHODS FOR DATA TRANSMISSION IN AN INACTIVE STATE

(71) Applicants: Javad Abdoli, Kanata (CA); Sanjeewa Herath, Ottawa (CA)

(72) Inventors: Javad Abdoli, Kanata (CA); Sanjeewa Herath, Ottawa (CA)

(73) Assignee: HUAWEI TECHNOLOGIES CO., LTD.

( * ) Notice: Subject to any disclaimer, the term of this patent is extended or adjusted under 35 U.S.C. 154(b) by 114 days.

(21) Appl. No.: 17/668,765

(22) Filed: Feb. 10, 2022

(65) Prior Publication Data

US 2022/0167387 A1 May 26, 2022

Related U.S. Application Data

(63) Continuation of application No. 16/664,302, filed on Oct. 25, 2019, now Pat. No. 11,284,429.

(51) Int. Cl.
*H04W 72/23* (2023.01)
*H04W 72/1273* (2023.01)
(Continued)

(52) U.S. Cl.
CPC .......... *H04W 72/23* (2023.01); *H03M 13/09* (2013.01); *H04L 1/1812* (2013.01); *H04W 72/1273* (2013.01)

(58) Field of Classification Search
CPC . H04W 72/23; H04W 72/1273; H03M 13/09; H04L 1/1812

(Continued)

(56) References Cited

U.S. PATENT DOCUMENTS 9,736,774 B2   8/2017 Au et al.
9,769,793 B2   9/2017 Zarifi et al.
(Continued)

FOREIGN PATENT DOCUMENTS

CN   107734705 A   2/2018
CN   108418661 A   8/2018
(Continued)

OTHER PUBLICATIONS

"3rd Generation Partnership Project; Technical Specification Group Radio Access Network; NR; Multiplexing and channel coding" (Release 15). Technical Specification. 3GPP TS 38.212 V15.7.0. Sep. 2019. 98 pages.

(Continued)

*Primary Examiner* — Peter G Solinsky

(57) ABSTRACT

Control signaling mechanisms are provided to support data transmissions to or from a user equipment (UE) in an inactive state. In some embodiments, a UE in an inactive state receives DCI including: a cyclic redundancy check (CRC) scrambled by a radio network temporary identifier (RNTI) that is specific to a group of UEs, the group of UEs including the UE; and a resource assignment for a data transmission to the UE. The data transmission is then received on a physical shared channel. In further embodiments, a UE in an inactive state receives DCI including: a CRC scrambled by a paging RNTI; and a resource assignment for a paging message to the UE. A data transmission is received by the UE in the paging message or in a further transmission that is scheduled by the paging message.

20 Claims, 8 Drawing Sheets

(51) Int. Cl.
*H04L 1/1812* (2023.01)
*H03M 13/09* (2006.01)

(58) Field of Classification Search
USPC .......................................................... 370/329
See application file for complete search history.

(56) References Cited

U.S. PATENT DOCUMENTS

| | | | |
|---|---|---|---|
| 10,897,708 | B2 | 1/2021 | Shih et al. |
| 11,284,429 | B2 * | 3/2022 | Abdoli ................. H04L 5/0055 |
| 2015/0195788 | A1 | 7/2015 | Au et al. |
| 2017/0303248 | A1 | 10/2017 | Chatterjee et al. |
| 2018/0097679 | A1 | 4/2018 | Zhang et al. |
| 2019/0074882 | A1 | 3/2019 | Zhou et al. |
| 2019/0223160 | A1 | 7/2019 | He et al. |
| 2019/0253308 | A1 | 8/2019 | Huang et al. |
| 2020/0351682 | A1 | 11/2020 | Cirik et al. |
| 2020/0389218 | A1 | 12/2020 | Faxer et al. |
| 2020/0413341 | A1 | 12/2020 | Xu et al. |
| 2021/0045056 | A1 | 2/2021 | Nam et al. |
| 2021/0051729 | A1 | 2/2021 | Lei et al. |
| 2021/0051759 | A1 | 2/2021 | Zhou et al. |
| 2021/0105808 | A1 * | 4/2021 | Lei ................... H04W 72/1273 |
| 2022/0167387 | A1 * | 5/2022 | Abdoli .............. H04W 72/1273 |

FOREIGN PATENT DOCUMENTS

| | | |
|---|---|---|
| CN | 110072285 A | 7/2019 |
| KR | 20190033408 A | 3/2019 |
| WO | WO-2022081948 A1 * | 4/2022 |

OTHER PUBLICATIONS

"3rd Generation Partnership Project; Technical Specification Group Radio Access Network; NR; Radio Resource Control (RRC) protocol specification" (Release 15). Technical Specification. 3GPP TS 38.331 V15.7.0. Sep. 2019. 526 pages.

Abbas, et al., Implementation of Physical Downlink Control Channel (PDCCH) for LTE Using FPGAA (Published on IEEEXplore Apr. 23, 2012) (Year: 2012). 5 pages.

Ericsson et al.,"Indication of CN initiated or RAN initiated paging",3GPP TSG-RAN WG2 #102,Busan, Republic of Korea, May 21-25, 2018, Tdoc R2 1806807, total:7pages.

* cited by examiner

SYSTEMS AND METHODS FOR DATA TRANSMISSION IN AN INACTIVE STATE

CROSS REFERENCE TO RELATED APPLICATIONS

The present application is a continuation of U.S. patent application Ser. No. 16/664,302, filed Oct. 25, 2019, the contents of which are hereby incorporated herein by reference.

TECHNICAL FIELD

The present disclosure relates generally to wireless communications, and in particular embodiments, to control signaling in wireless communication networks.

BACKGROUND

In some wireless communication networks, user equipments (UEs) wirelessly communicate with a base station to send data to the base station and/or receive data from the base station. A wireless communication from a UE to a base station is referred to as an uplink (UL) communication. A wireless communication from a base station to a UE is referred to as a downlink (DL) communication. A wireless communication from a first UE to a second UE is referred to as a sidelink (SL) communication or a device-to-device (D2D) communication.

In 3GPP New Radio (NR), a UE may operate in one of the following three states: RRC_IDLE, RRC_CONNECTED and RRC_INACTIVE. In the RRC_CONNECTED state, a UE is connected to the network following a connection establishment procedure. In the RRC_IDLE state, a UE is not connected to the network, but the network knows that the UE is present in the network. Switching to the RRC_IDLE state helps save network resources and UE power (for example, battery life) when the UE is not communicating with the network. The RRC_INACTIVE state also helps save network resources and UE power when the UE is not communicating with the network. However, unlike the RRC_IDLE state, when a UE is in the RRC_INACTIVE state the network and the UE both store at least some configuration information to allow the UE to reconnect to the network more rapidly.

Conventionally, when a UE is in the RRC_INACTIVE state, data transmission to and from the UE is limited.

SUMMARY

The RRC_INACTIVE state is an example of an inactive state. Currently, there is no control signaling mechanism to support data transmission to or from a UE that is in the RRC_INACTIVE state. Some embodiments of the present disclosure provide control signaling mechanisms to support data transmission in the RRC_INACTIVE state, and more generally in any inactive state.

According to an aspect of the present disclosure, there is provided a method. The method includes receiving, by a user equipment (UE) in an inactive state, downlink control information (DCI) and receiving, by the UE in the inactive state, a data transmission on a physical shared channel. The DCI includes a cyclic redundancy check (CRC) scrambled by a radio network temporary identifier (RNTI) that is specific to a group of UEs, the group of UEs including the UE. The DCI further includes a resource assignment for the data transmission to the UE, wherein the resource assignment indicates that a unicast or multicast data transmission is scheduled.

In some embodiments, the DCI further includes a short message.

In some embodiments, the DCI further includes an indication of a hybrid automatic repeat request (HARQ) process associated with the data transmission.

In some embodiments, the DCI further includes a measurement request.

In some embodiments, the RNTI is specific to the inactive state.

In some embodiments, the RNTI is specific to the UE and, optionally, the RNTI is based on another identifier that is specific to the UE.

In some embodiments, the RNTI is a first RNTI, and the method further includes receiving, by the UE in the inactive state, further DCI including a further CRC scrambled by a paging RNTI different from the first RNTI. The DCI is size-matched with the further DCI.

In some embodiments, the physical shared channel is a physical downlink shared channel or a physical sidelink shared channel.

In some embodiments, the resource assignment includes at least one of: a frequency domain resource assignment, a time domain resource assignment, a virtual resource block to physical resource bock mapping, a modulation and coding scheme, and a transport block scaling factor.

According to another aspect of the present disclosure, there is provided a user equipment (UE). The UE includes a processor to configure the UE in an inactive state and a receiver to receive downlink control information (DCI) while the UE is in the inactive state and to receive a data transmission on a physical shared channel while the UE is in the inactive state. The DCI includes a cyclic redundancy check (CRC) scrambled by a radio network temporary identifier (RNTI) that is specific to a group of UEs, the group of UEs including the UE and a resource assignment for the data transmission, wherein the resource assignment indicates that a unicast or multicast data transmission is scheduled.

In some embodiments, the DCI further includes a short message.

In some embodiments, the DCI further includes an indication of a hybrid automatic repeat request (HARQ) process associated with the data transmission.

In some embodiments, the DCI further includes a measurement request.

In some embodiments, the RNTI is specific to the inactive state.

In some embodiments, the RNTI is specific to the UE and, optionally, the RNTI is based on another identifier that is specific to the UE.

In some embodiments, the RNTI is a first RNTI, and the method further includes receiving, by the UE in the inactive state, further DCI including a further CRC scrambled by a paging RNTI different from the first RNTI. The DCI is size-matched with the further DCI.

In some embodiments, the physical shared channel is a physical downlink shared channel or a physical sidelink shared channel.

In some embodiments, the resource assignment includes at least one of: a frequency domain resource assignment, a time domain resource assignment, a virtual resource block to physical resource bock mapping, a modulation and coding scheme, and a transport block scaling factor.

BRIEF DESCRIPTION OF THE DRAWINGS

For a more complete understanding of the present embodiments, and the advantages thereof, reference is now made, by way of example, to the following descriptions taken in conjunction with the accompanying drawings, in which.

DETAILED DESCRIPTION OF ILLUSTRATIVE EMBODIMENTS

For illustrative purposes, specific example embodiments will now be explained in greater detail below in conjunction with the figures.

The embodiments set forth herein represent information sufficient to practice the claimed subject matter and illustrate ways of practicing such subject matter. Upon reading the following description in light of the accompanying figures, those of skill in the art will understand the concepts of the claimed subject matter and will recognize applications of these concepts not particularly addressed herein. It should be understood that these concepts and applications fall within the scope of the disclosure and the accompanying claims.

Moreover, it will be appreciated that any module, component, or device disclosed herein that executes instructions may include or otherwise have access to a non-transitory computer/processor readable storage medium or media for storage of information, such as computer/processor readable instructions, data structures, program modules, and/or other data. A non-exhaustive list of examples of non-transitory computer/processor readable storage media includes magnetic cassettes, magnetic tape, magnetic disk storage or other magnetic storage devices, optical disks such as compact disc read-only memory (CD-ROM), digital video discs or digital versatile discs (i.e. DVDs), Blu-ray Disc™, or other optical storage, volatile and non-volatile, removable and non-removable media implemented in any method or technology, random-access memory (RAM), read-only memory (ROM), electrically erasable programmable read-only memory (EEPROM), flash memory or other memory technology. Any such non-transitory computer/processor storage media may be part of a device or accessible or connectable thereto. Computer/processor readable/executable instructions to implement an application or module described herein may be stored or otherwise held by such non-transitory computer/processor readable storage media.

FIGS. 1, 2A, 2B and 3 illustrate examples of networks and devices that could implement any or all aspects of the present disclosure.

Figure 1:
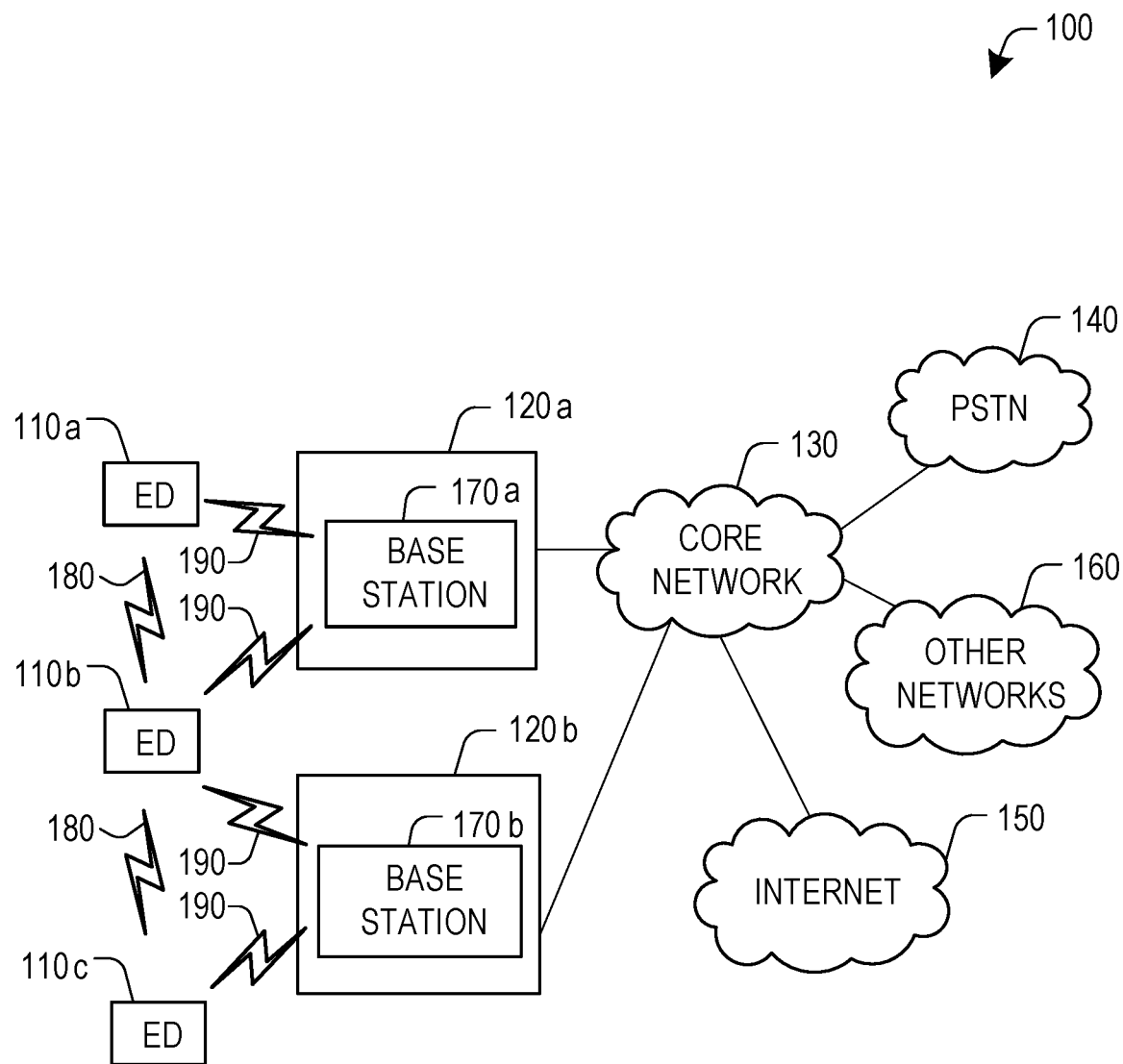
FIG. 1 is a schematic diagram of a communication system in which embodiments of the disclosure may occur.

FIG. 1 illustrates an example communication system 100. In general, the system 100 enables multiple wireless or wired elements to communicate data and other content. The purpose of the system 100 may be to provide content (voice, data, video, text) via broadcast, narrowcast, user device to user device, etc. The system 100 may operate efficiently by sharing resources such as bandwidth.

In this example, the communication system 100 includes electronic devices (ED) 110a-110c, radio access networks (RANs) 120a-120b, a core network 130, a public switched telephone network (PSTN) 140, the Internet 150, and other networks 160. Although certain numbers of these components or elements are shown in FIG. 1, any reasonable number of these components or elements may be included in the system 100.

The EDs 110a-110c are configured to operate, communicate, or both, in the system 100. For example, the EDs 110a-110c are configured to transmit, receive, or both via wireless communication channels. Each ED 110a-110c represents any suitable end user device for wireless operation and may include such devices (or may be referred to) as a user equipment/device (UE), wireless transmit/receive unit (WTRU), mobile station, mobile subscriber unit, cellular telephone, station (STA), machine type communication device (MTC), personal digital assistant (PDA), smartphone, laptop, computer, touchpad, wireless sensor, or consumer electronics device.

In FIG. 1, the RANs 120a-120b include base stations 170a-170b, respectively. Each base station 170a-170b is configured to wirelessly interface with one or more of the EDs 110a-110c to enable access to any other base station 170a-170b, the core network 130, the PSTN 140, the internet 150, and/or the other networks 160. For example, the base stations 170a-170b may include (or be) one or more of several well-known devices, such as a base transceiver station (BTS), a Node-B (NodeB), an evolved NodeB (eNodeB), a Home eNodeB, a gNodeB, a transmission and receive point (TRP), a site controller, an access point (AP), or a wireless router. Any ED 110a-110c may be alternatively or additionally configured to interface, access, or communicate with any other base station 170a-170b, the internet 150, the core network 130, the PSTN 140, the other networks 160, or any combination of the preceding. The communication system 100 may include RANs, such as RAN 120b, wherein the corresponding base station 170b accesses the core network 130 via the internet 150, as shown.

The EDs 110a-110c and base stations 170a-170b are examples of communication equipment that can be configured to implement some or all of the functionality and/or embodiments described herein. In the embodiment shown in FIG. 1, the base station 170a forms part of the RAN 120a, which may include other base stations, base station controller(s) (BSC), radio network controller(s) (RNC), relay nodes, elements, and/or devices. Any base station 170a, 170b may be a single element, as shown, or multiple elements, distributed in the corresponding RAN, or otherwise. Also, the base station 170b forms part of the RAN 120b, which may include other base stations, elements, and/or devices. Each base station 170a-170b transmits and/ or receives wireless signals within a particular geographic region or area, sometimes referred to as a "cell" or "coverage area". A cell may be further divided into cell sectors, and a base station 170a-170b may, for example, employ multiple transceivers to provide service to multiple sectors. In some embodiments, there may be established pico or femto cells where the radio access technology supports such. In some embodiments, multiple transceivers could be used for each cell, for example using multiple-input multiple-output (MIMO) technology. The number of RAN 120a-120b shown is exemplary only. Any number of RAN may be contemplated when devising the communication system 100.

The base stations 170a-170b communicate with one or more of the EDs 110a-110c over one or more air interfaces 190 using wireless communication links e.g. radio frequency (RF), microwave, infrared (IR), etc. The air interfaces 190 may utilize any suitable radio access technology. For example, the communication system 100 may implement one or more orthogonal or non-orthogonal channel access methods, such as code division multiple access (CDMA), time division multiple access (TDMA), frequency division multiple access (FDMA), orthogonal FDMA (OFDMA), or single-carrier FDMA (SC-FDMA) in the air interfaces 190.

A base station 170a-170b may implement Universal Mobile Telecommunication System (UMTS) Terrestrial Radio Access (UTRA) to establish an air interface 190 using wideband CDMA (WCDMA). In doing so, the base station 170a-170b may implement protocols such as High Speed Packet Access (HSPA), Evolved HPSA (HSPA+) optionally including High Speed Downlink Packet Access (HSDPA), High Speed Packet Uplink Access (HSUPA) or both. Alternatively, a base station 170a-170b may establish an air interface 190 with Evolved UTMS Terrestrial Radio Access (E-UTRA) using LTE, LTE-A, LTE-B and/or 5G New Radio (NR). It is contemplated that the communication system 100 may use multiple channel access functionality, including such schemes as described above. Other radio technologies for implementing air interfaces include IEEE 802.11, 802.15, 802.16, CDMA2000, CDMA2000 1x, CDMA2000 EV-DO, IS-2000, IS-95, IS-856, GSM, EDGE, and GERAN. Of course, other multiple access schemes and wireless protocols may be utilized.

The RANs 120a-120b are in communication with the core network 130 to provide the EDs 110a-110c with various services such as voice, data, and other services. The RANs 120a-120b and/or the core network 130 may be in direct or indirect communication with one or more other RANs (not shown), which may or may not be directly served by core network 130, and may or may not employ the same radio access technology as RAN 120a, RAN 120b or both. The core network 130 may also serve as a gateway access between (i) the RANs 120a-120b or EDs 110a-110c or both, and (ii) other networks (such as the PSTN 140, the internet 150, and the other networks 160).

The EDs 110a-110c communicate with one another over one or more SL air interfaces 180 using wireless communication links e.g. radio frequency (RF), microwave, infrared (IR), etc. The SL air interfaces 180 may utilize any suitable radio access technology, and may be substantially similar to the air interfaces 190 over which the EDs 110a-110c communication with one or more of the base stations 170a-170c, or they may be substantially different. For example, the communication system 100 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the SL air interfaces 180. In some embodiments, the SL air interfaces 180 may be, at least in part, implemented over unlicensed spectrum.

In this disclosure, the SL transmissions between cooperating UEs may be "grant-free" transmissions or as a mode for data transmissions that are performed without communicating dynamic scheduling. Grant-free transmissions are sometimes called "configured grant", "grant-less", "schedule free", or "schedule-less" transmissions. Grant-free SL transmissions can also be referred to as SL "transmission without grant", "transmission without dynamic grant", "transmission without dynamic scheduling", or "transmission using configured grant", for example.

A configured grant transmission typically requires the receiver to know the parameters and resources used by the transmitter for the transmission. However, in the context of SL transmissions, the receiving UE is typically not aware of the transmitting UE's configuration parameters, such as which UE is transmitting, the ultimate target of the data (e.g., another UE), the time-domain and frequency-domain communication resources used for the transmission, and other control information. The various methods will, however, each incur a respective overhead penalty.

In addition, some or all of the EDs 110a-110c may include functionality for communicating with different wireless networks over different wireless links using different wireless technologies and/or protocols. Instead of wireless communication (or in addition thereto), the EDs may communicate via wired communication channels to a service provider or switch (not shown), and to the internet 150. PSTN 140 may include circuit switched telephone networks for providing plain old telephone service (POTS). Internet 150 may include a network of computers and subnets (intranets) or both, and incorporate protocols, such as internet protocol (IP), transmission control protocol (TCP) and user datagram protocol (UDP). EDs 110a-110c may be multimode devices capable of operation according to multiple radio access technologies, and incorporate multiple transceivers necessary to support multiple radio access technologies.

Figure 2A:
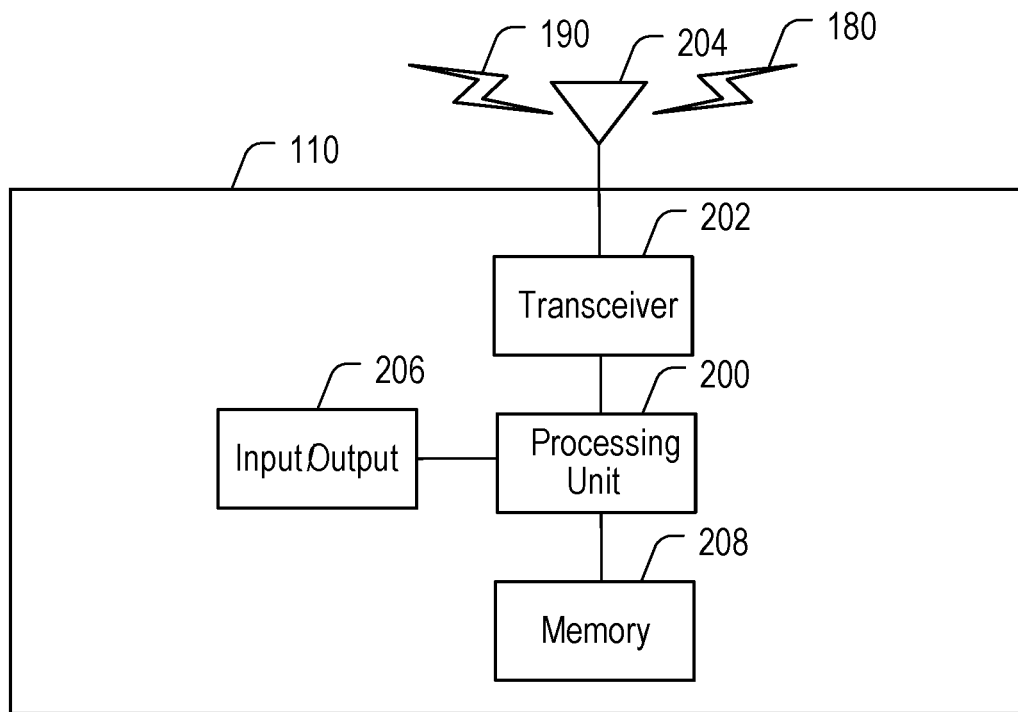
FIGS. 2A and 2B are block diagrams of an example user equipment and base station, respectively, according to aspects of the present disclosure.
Figure 2B:
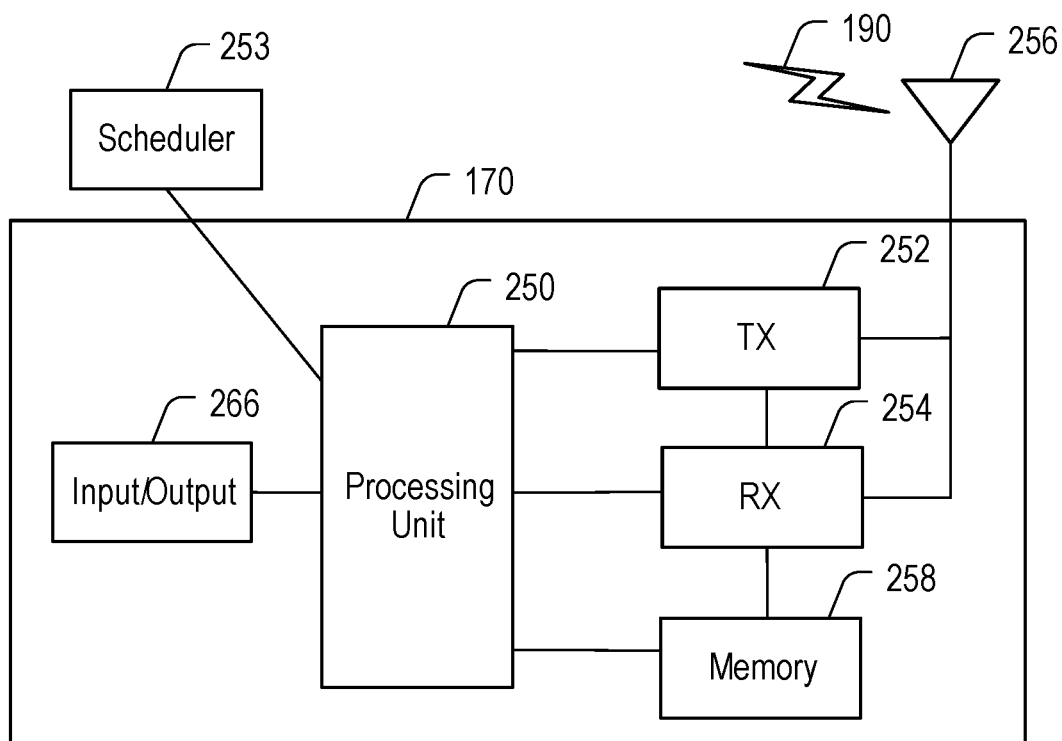

FIGS. 2A and 2B illustrate example devices that may implement the methods and teachings according to this disclosure. In particular, FIG. 2A illustrates an example ED 110, and FIG. 2B illustrates an example base station 170. These components could be used in the system 100 or in any other suitable system.

As shown in FIG. 2A, the ED 110 includes at least one processor or processing unit 200. The processing unit 200 implements various processing operations of the ED 110. For example, the processing unit 200 could perform signal coding, bit scrambling, data processing, power control, input/output processing, or any other functionality enabling the ED 110 to operate in the communication system 100. The processing unit 200 may also be configured to implement some or all of the functionality and/or embodiments described in more detail herein. Each processing unit 200 includes any suitable processing or computing device configured to perform one or more operations. Each processing unit 200 could, for example, include a microprocessor, microcontroller, digital signal processor, field programmable gate array, or application specific integrated circuit.

The ED 110 also includes at least one transceiver 202. The transceiver 202 is configured to modulate data or other content for transmission by at least one antenna or Network Interface Controller (NIC) 204. The transceiver 202 is also configured to demodulate data or other content received by the at least one antenna 204. Each transceiver 202 includes any suitable structure for generating signals for wireless or wired transmission and/or processing signals received wirelessly or by wire. Each antenna 204 includes any suitable structure for transmitting and/or receiving wireless or wired signals. One or multiple transceivers 202 could be used in the ED 110. One or multiple antennas 204 could be used in the ED 110. Although shown as a single functional unit, a transceiver 202 could also be implemented using at least one transmitter and at least one separate receiver.

The ED 110 further includes one or more input/output devices 206 or interfaces (such as a wired interface to the internet 150). The input/output devices 206 permit interaction with a user or other devices in the network. Each input/output device 206 includes any suitable structure for providing information to or receiving information from a user, such as a speaker, microphone, keypad, keyboard, display, or touch screen, including network interface communications.

In addition, the ED 110 includes at least one memory 208. The memory 208 stores instructions and data used, generated, or collected by the ED 110. For example, the memory 208 could store software instructions or modules configured to implement some or all of the functionality and/or embodiments described above and that are executed by the processing unit(s) 200. Each memory 208 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 2B, the base station 170 includes at least one processing unit 250, at least one transmitter 252, at least one receiver 254, one or more antennas 256, at least one memory 258, and one or more input/output devices or interfaces 266. A transceiver, not shown, may be used instead of the transmitter 252 and receiver 254. A scheduler 253 may be coupled to the processing unit 250. The scheduler 253 may be included within or operated separately from the base station 170. The processing unit 250 implements various processing operations of the base station 170, such as signal coding, bit scrambling, data processing, power control, input/output processing, or any other functionality. The processing unit 250 can also be configured to implement some or all of the functionality and/or embodiments described in more detail above. Each processing unit 250 includes any suitable processing or computing device configured to perform one or more operations. Each processing unit 250 could, for example, include a microprocessor, microcontroller, digital signal processor, field programmable gate array, or application specific integrated circuit.

Each transmitter 252 includes any suitable structure for generating signals for wireless or wired transmission to one or more EDs or other devices. Each receiver 254 includes any suitable structure for processing signals received wirelessly or by wire from one or more EDs or other devices. Although shown as separate components, at least one transmitter 252 and at least one receiver 254 could be combined into a transceiver. Each antenna 256 includes any suitable structure for transmitting and/or receiving wireless or wired signals. Although a common antenna 256 is shown here as being coupled to both the transmitter 252 and the receiver 254, one or more antennas 256 could be coupled to the transmitter(s) 252, and one or more separate antennas 256 could be coupled to the receiver(s) 254. Each memory 258 includes any suitable volatile and/or non-volatile storage and retrieval device(s) such as those described above in connection to the ED 110. The memory 258 stores instructions and data used, generated, or collected by the base station 170. For example, the memory 258 could store software instructions or modules configured to implement some or all of the functionality and/or embodiments described above and that are executed by the processing unit(s) 250.

Each input/output device 266 permits interaction with a user or other devices in the network. Each input/output device 266 includes any suitable structure for providing information to or receiving/providing information from a user, including network interface communications.

Additional details regarding the UEs 110 and the base stations 170 are known to those of skill in the art. As such, these details are omitted here for clarity.

Figure 3:
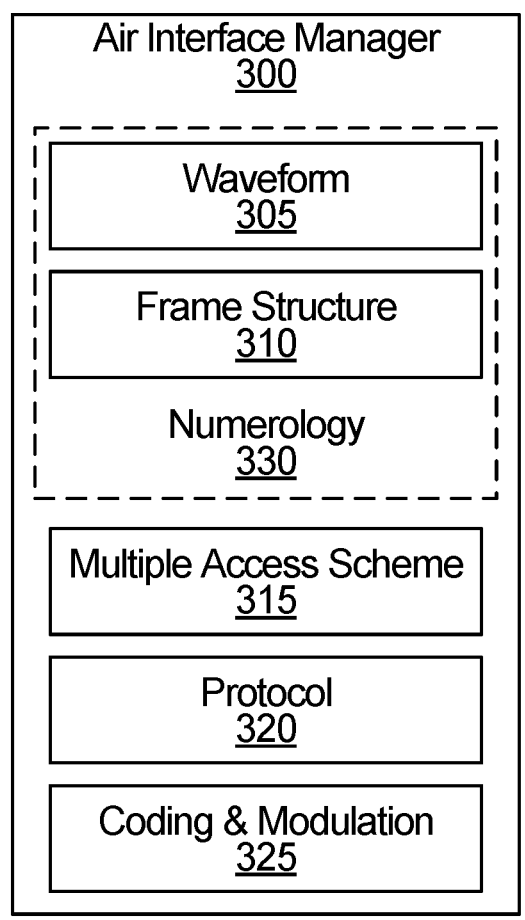
FIG. 3 is a block diagram of an air interface manager for configuring a software-configurable air interface according to an aspect of the present disclosure.

FIG. 3 illustrates a schematic diagram of an air interface manager 300 for configuring a software-configurable air interface 190. The air interface manager 300 may be, for example, a module including a number of components or building blocks that define the parameters of the air interface 190 and collectively specify how a transmission is to be made and/or received by the air interface 190. The air interface manger 300 could also or instead define the parameters of the SL air interface 180 and specify how a transmission is to be made and/or received by the SL air interface 180

The components of the air interface manger 300 include at least one of a waveform component 305, a frame structure component 310, a multiple access scheme component 315, a protocol component 320, and a modulation and coding component 325.

The waveform component 305 may specify a shape and form of a signal being transmitted. Waveform options may include orthogonal multiple access waveforms and non-orthogonal multiple access waveforms. Non-limiting examples of such waveform options include Single-Carrier (SC), Ultra Wideband (UWB), Frequency Modulated Continuous Wave (FMCW), Linear Frequency Modulated (LFM), Orthogonal Frequency Division Multiplexing (OFDM), Single-Carrier Frequency Division Multiple Access (SC-FDMA), Filtered OFDM (f-OFDM), Time windowing OFDM, Filter Bank Multicarrier (FBMC), Universal Filtered Multicarrier (UFMC), Generalized Frequency Division Multiplexing (GFDM), Wavelet Packet Modulation (WPM), Faster Than Nyquist (FTN) Waveform, and low Peak to Average Power Ratio Waveform (low PAPR WF). In some embodiments, a combination of waveform options is possible. A LFM-OFDM waveform is a non-limiting example of such a combination.

The frame structure component 310 may specify a configuration of a frame or group of frames. The frame structure component 310 may indicate one or more of a time, frequency, pilot signature, code, or other parameter of the frame or group of frames.

Non-limiting examples of frame structure options include: the number of symbols in the time slot, the number of time slots in the frame and the duration of each time slot (sometimes known as a transmission time interval, TTI, or a transmission time unit, TTU). The frame structure component may also specify whether the time slot is a configurable multi-level TTI, a fixed TTI, or a configurable single-level TTI. The frame structure component may further specify a co-existence mechanism for different frame structure configurations.

For some waveforms, such as certain OFDM-based waveforms, the frame structure component may also specify one or more associated waveform parameters, such as subcarrier spacing width, symbol duration, cyclic prefix (CP) length, channel bandwidth, guard bands/subcarriers, and sampling size and frequency.

Additionally, the frame structure component 310 may further specify whether the frame structure is used in a time-division duplex communication or a frequency-division duplex communication.

Additionally, the frame structure component 310 may further specify the transmission state and/or direction for each symbol in a frame. For example, each symbol may independently be configured as a downlink symbol, an uplink symbol, or a flexible symbol.

Together, the specifications of the waveform component and the frame structure component are sometimes known as the "numerology." Thus, the air interface 190 may include a numerology component 330 defining a number of air interface configuration parameters, such as the subcarrier spacing, CP length, symbol length, slot length, and symbols per slot.

These numerologies, also known as subcarrier spacing configurations, may be scalable in the sense that subcarrier spacings of different numerologies are multiples of each other, and time slot lengths of different numerologies are also multiples of each other. Such a scalable design across multiple numerologies provides implementation benefits, for example scalable total OFDM symbol duration in a time division duplex (TDD) context.

Frames can be configured using one or a combination of scalable numerologies. For example, a numerology with 60 kHz subcarrier spacing has a relatively short OFDM symbol duration (because OFDM symbol duration varies inversely with subcarrier spacing), which makes the 60 kHz numerology particularly suitable for ultra-low latency communications, such as Vehicle-to-Any (V2X) communications. A further example of a numerology with a relatively short OFDM symbol duration suitable for low latency communications is a numerology with 30 kHz subcarrier spacing. A numerology with 15 kHz subcarrier spacing may be compatible with LTE. A numerology with 15 kHz subcarrier spacing may serve as a default numerology for initial access of a device to a network. This 15 kHz numerology may also be suitable for broadband services. A numerology with 7.5 kHz spacing, which has a relatively long OFDM symbol duration, may be particularly useful for coverage enhancement and broadcasting. Additional uses for these numerologies will be or become apparent to persons of ordinary skill in the art. Of the four numerologies listed, those with 30 kHz and 60 kHz subcarrier spacings are more robust to Doppler spreading (fast moving conditions), because of the wider subcarrier spacing. It is further contemplated that different numerologies may use different values for other physical layer parameters, such as the same subcarrier spacing and different cyclic prefix lengths. In addition, subcarrier spacing may depend on the operational frequency band. For example, the subcarrier spacing in millimeter wave frequencies may be higher than in lower frequencies.

It is further contemplated that other subcarrier spacings may be used, such as higher or lower subcarrier spacings. For example, other subcarrier spacings varying by a factor of $2^n$ include 120 kHz and 3.75 kHz.

In other examples, a more limited scalability may be implemented, in which two or more numerologies all have subcarrier spacings that are integer multiples of the smallest subcarrier spacing, without necessarily being related by a factor of $2^n$. Examples include 15 kHz, 30 kHz, 45 kHz, 60 kHz subcarrier spacings.

In still other examples, non-scalable subcarrier spacings may be used, which are not all integer multiples of the smallest subcarrier spacing, such as 15 kHz, 20 kHz, 30 kHz, 60 kHz.

OFDM-based signals can be employed to transmit a signal in which multiple numerologies coexist simultaneously. More specifically, multiple sub-band OFDM signals can be generated in parallel, each within a different sub-band, and each sub-band having a different subcarrier spacing (and more generally with a different numerology). The multiple sub-band signals are combined into a single signal for transmission, for example for downlink transmissions. Alternatively, the multiple sub-band signals may be transmitted from separate transmitters, for example for uplink transmissions from multiple electronic devices (EDs), which may be user equipments (UEs).

The use of different numerologies can allow the air interface 190 to support coexistence of a diverse set of use cases having a wide range of quality of service (QoS) requirements, such as different levels of latency or reliability tolerance, as well as different bandwidth or signaling overhead requirements. In one example, the base station can signal to the ED an index representing a selected numerology, or a single parameter (e.g., subcarrier spacing) of the selected numerology. Based on this signaling, the ED may determine the parameters of the selected numerology from other information, such as a look-up table of candidate numerologies stored in memory.

Continuing with the components of the air interface 190, the multiple access scheme component 315 may specify how access to a channel is granted for one or more EDs. Non-limiting examples of multiple access technique options include technologies defining how EDs share a common physical channel, such as: Time Division Multiple Access (TDMA), Frequency Division Multiple Access (FDMA), Code Division Multiple Access (CDMA), Space Division Multiple Access (SDMA), Single Carrier Frequency Division Multiple Access (SC-FDMA), Low Density Signature Multicarrier Code Division Multiple Access (LDS-MC-CDMA), Non-Orthogonal Multiple Access (NOMA), Pattern Division Multiple Access (PDMA), Lattice Partition Multiple Access (LPMA), Resource Spread Multiple Access (RSMA), and Sparse Code Multiple Access (SCMA). Any of these multiple access technique options may be implemented using one or more of: scheduled access; non-scheduled access, also known as grant-free access or configured grant access; non-orthogonal multiple access; orthogonal multiple access, e.g., via a dedicated channel resource (i.e., no sharing between multiple EDs); contention-based shared channel resource; non-contention-based shared channel resource; and cognitive radio-based access.

The protocol component 320 may specify how a transmission and/or a re-transmission are to be made. Non-limiting examples of transmission and/or re-transmission mechanism options include those that specify a scheduled data pipe size and a signaling mechanism for transmission and/or re-transmission.

The modulation and coding component 325 may specify how information being transmitted may be encoded/decoded and modulated/demodulated for transmission/reception purposes. Coding may refer to methods of error detection and forward error correction. Non-limiting examples of coding options include turbo trellis codes, turbo product codes, fountain codes, low-density parity check codes, and polar codes. Modulation may refer, simply, to Quadrature Amplitude Modulation (QAM) specified by a complex constellation (including, for example, the modulation technique and order, e.g. 16QAM, 64QAM, etc.), or more specifically to various types of advanced modulation methods such as hierarchical modulation, multi-dimensional modulation and low Peak-to-Average Power Ratio (PAPR) modulation.

Because an air interface includes a plurality of components or building blocks, and each component may have a plurality of candidate technologies (also referred to herein as air interface capability options), the air interface manager 300 may configure and store a large number of different air interface profiles. Each air interface profile defines a respective set of air interface capability options.

For example, in each air interface profile defining a respective set of air interface capability options, an air interface capability option is selected for each of the component building blocks of the air interface. Each of the different air interface profiles may be targeted to meet a different set of transmission requirements, including transmission content, transmit condition, and receive condition.

According to the transmission requirements of a pair of communicating transmitting-receiving devices, one of the different air interface profiles that best meet the transmission requirements may be selected from the air interface manager 300 and used for communications between the pair of communicating transmitting-receiving devices.

In further embodiments, the air interface manager 300 may modify or update its components, profiles, or capability options. For example, the air interface manager 300 may replace the waveform and frame structure components 305, 310 with a single numerology component 330. Conversely, the air interface manager 300 may separate the modulation and coding component 325 into an individual coding component and an individual modulation component. Furthermore, the air interface manager 300 is configurable such that new soft air interface configuration components developed in the future should be able to be utilized.

The air interface manager 300 may also update certain components to modify the capability options of any given component. For example, the air interface manager 300 may update the modulation and coding component 325 to include higher-order modulation schemes.

By updating the stored components, profiles, and candidate options, the air interface manager 300 can flexibly adapt to better accommodate diverse wireless traffic types and services. Modifying or updating components, profiles, and candidate options may allow the air interface manager 300 to provide suitable air interface profiles for traffic types or services other than those already contemplated for ultra-reliable low latency communications (URLLC), enhanced mobile broadband (eMBB), and massive machine-type communications (mMTC).

As noted above, in 3GPP New Radio (NR), a UE may operate in one of the following three states: RRC_IDLE, RRC_CONNECTED and RRC_INACTIVE.

The RRC_CONNECTED state is a non-limiting example of a connected or active state. A UE in the RRC_CONNECTED state is connected to the radio access network (RAN) and to the core network (CN). The UE could enter the RRC_CONNECTED state from the RRC_IDLE state following a connection establishment procedure or from the RRC_INACTIVE state following a connection resumption procedure, for example. The RRC_CONNECTED state can be characterized as including the following features:

the UE stores the access stratum (AS) context;
a transfer of unicast data to and from the UE is supported;
at lower layers, the UE may be configured with UE-specific discontinuous reception (DRX);
for UEs supporting carrier aggregation (CA), use of one or more secondary cells (SCells), aggregated with a special cell (SpCell), is supported for increased bandwidth;
for UEs supporting dual connectivity (DC), use of a secondary cell group (SCG), aggregated with the master cell group (MCG), is supported for increased bandwidth;
network controlled mobility is supported within a NR network and to/from an E-UTRA network;
the UE monitors short messages transmitted with a paging radio network temporary identifier (P-RNTI) over downlink control information (DCI), if configured;
the UE monitors control channels associated with the shared data channel to determine if data is scheduled for the UE;
the UE provides channel quality and feedback information to the network;
the UE performs neighboring cell measurements and measurement reporting; and
the UE acquires system information.

The RRC_IDLE state is a non-limiting example of an idle or disconnected state. A UE in the RRC_IDLE state is not connected to the RAN or the CN, and the UE may need to perform an initial access procedure to establish a connection to the network and transition to the RRC_CONNECTED state. The RRC_IDLE state can be characterized as including the following features:

UE-specific DRX may be configured by upper layers of the network;
UE controlled mobility is based on network configuration;
the UE monitors short messages transmitted with the P-RNTI over DCI;
the UE monitors a paging channel for CN paging using a 5G system architecture evolution temporary mobile station identifier (5G-S-TMSI);
the UE performs neighboring cell measurements and cell selection or cell reselection; and
the UE acquires system information (SI) and can send a SI request, if configured.

The RRC_INACTIVE state is a non-limiting example of an inactive state. A UE in an inactive state uses fewer network resources and/or less power than a UE in a connected state. This may save battery life at the UE. When a UE transitions to the inactive state, configuration information for the UE is stored by the UE and the network. This allows the UE to return to the connected state relatively quickly and efficiently. For example, a UE may use less signaling to transition from an inactive state to a connected state than from an idle state to a connected state.

The RRC_INACTIVE state could be considered to lie between the RRC_CONNECTED and RRC_IDLE states. In the RRC_INACTIVE state, at least a portion of the UE's AS context is stored by both the UE and the network, which allows the network to communicate with the UE. Therefore, secure and fast signaling could occur between the network and the UE. Moreover, a UE in the RRC_IDLE state might only support CN paging that is performed in the tracking area where the UE is located. In contrast, a UE in the RRC_INACTIVE state may, in addition to CN paging, also support RAN paging that is performed in the RAN notification area (RNA) where the UE is located. Because a RNA typically covers a smaller number of cells than a tracking area, RAN paging in the RRC_INACTIVE state may incur less DL resource consumption and/or overhead. The RRC_INACTIVE state can be characterized as including the following features:
- UE-specific DRX may be configured by upper layers of the network or by the RRC layer;
- UE controlled mobility is based on network configuration;
- the UE stores an inactive AS context, which could be different from the AS context used in the RRC_CONNECTED state;
- a RAN-based notification area is configured by the RRC layer;
- the UE monitors short messages transmitted with P-RNTI over DCI;
- the UE monitors a paging channel for CN paging using 5G-S-TMSI and RAN paging using a FullI-RNTI;
- the UE performs neighboring cell measurements and cell selection or cell reselection;
- the UE performs RAN-based notification area updates periodically and when moving outside the configured RAN-based notification area; and
- the UE acquires SI and can send an SI request, if configured.

The RRC_INACTIVE state is implemented in NR, but in general an inactive state could be implemented in any wireless protocol or radio technology. Accordingly, inactive states are not limited to a particular wireless protocol or radio technology. Similar comments apply to idle states and connected states.

A UE can transition from a connected state to an inactive state using a suspend procedure, and transition back to the connected state using a resume procedure. The UE can also transition from the inactive state to the idle state using a release procedure. The transition from the connected state to the inactive state is invisible to the CN. Therefore, when a UE is in the inactive state, UE-related signaling and data exchange can occur between the RAN and the CN. From the perspective of the CN, a UE in the inactive state is treated in a similar manner to a UE in the connected state. For example, from the perspective of the CN, a UE may have two connection management (CM) states. The UE is either in a CM-CONNECTED state or a CM-IDLE state. A UE in the CM-IDLE state in the CN is in the RRC_IDLE state from the RAN point of view, whereas a UE in the CM-CONNECTED state in the CN may be either in the RRC_CONNECTED state or the RRC_INACTIVE state from the RAN point of view. The UE's security context and/or other portions of the UE's context is/are stored by the UE and by the network before the UE transitions from the connected state to the inactive state. Thus, the network can quickly and securely transmit signaling to the UE for a transition from the inactive state to the connected or idle states.

Paging messages can be used by a network to facilitate a UE transition to a connected state from an idle state or from an inactive state. The paging messages can be received over a paging physical DL shared channel (paging PDSCH), for example. The network initiates a paging procedure by transmitting a paging message at a UE's paging occasion. The network may address multiple UEs using a single paging message by including multiple UE identities (IDs) in a paging record that is carried by the paging message. A paging record is a set of UE IDs that correspond to UEs being paged by the network. In 3GPP NR Specification #TS38.331, an example of a paging record is the PagingRecord parameter and an example of a UE ID is the ue-Identity parameter.

In some embodiments, a UE in an idle or inactive state monitors a paging search space for a physical DL control channel (PDCCH) containing paging DCI. An example of paging DCI in NR is DCI format 1_0 having a cyclic redundancy check (CRC) scrambled or masked with the P-RNTI. UEs in an idle or inactive state know the P-RNTI, and therefore these UEs are able to descramble or demask the CRC, and use the CRC to check if decoding of the DCI format 1_0 was successful. The DCI format 1_0 includes, among other information, either or both of a short message and scheduling information for a paging message. The scheduling information for the paging message could include a resource assignment with a frequency domain resource assignment, a time domain resource assignment, a virtual resource block (VRB)-to-physical resource block (PRB) mapping, a modulation and coding scheme (MCS), and/or transport block (TB) scaling. By way of example, DCI format 1_0 having a CRC scrambled by the P-RNTI could include any or all of the following bit fields:
- Short message indicator—2 bits in length;
- Short message—8 bits in length;
- Frequency domain resource assignment for a paging message—$\lceil \log_2(N_{RB}^{DL,BWP}(N_{RB}^{DL,BWP}+1)/2) \rceil$ bits in length, where $N_{RB}^{DL,BWP}$ could be equal to the size of the control resource set (CORESET) 0 (if only the short message is carried, then this bit field is reserved);
- Time domain resource assignment for the paging message—4 bits in length (if only the short message is carried, this bit field is reserved);
- VRB-to-PRB mapping for the paging message—1 bit in length (if only the short message is carried, this bit field is reserved);
- MCS for the paging message—5 bits in length (if only the short message is carried, this bit field is reserved);
- TB scaling for the paging message—2 bits in length (if only the short message is carried, this bit field is reserved); and
- Reserved bits—6 bits in length.

Throughout this disclosure, the terms "resource assignment" and "resource allocation" are equivalent and can be interchangeably used.

In the case that paging DCI contains a resource assignment for a paging message, a UE that receives the paging DCI proceeds to receive the scheduled paging message based on the resource assignment. When a UE in an idle state receives a paging message, the UE may determine if any of the UE IDs included in each paging record of the paging message match the particular ID allocated to the UE by upper layers of the network. In NR, 5G-S-TMSI is used as the UE ID for paging a UE in the RRC_IDLE state. In the case that a UE ID in a paging record matches the particular ID of the UE, then the UE may initiate a connection to the network, i.e. transition to a connected state, by forwarding the UE's particular ID and an access type, if present, to the upper layers of the UE. An access type for a UE may be included as the accessType parameter in the paging message as specified in 3GPP NR Specification #TS38.331.

When a UE in an inactive state receives a paging message, the UE may determine if the UE ID included in each paging record of the paging message matches the UE's stored FullI-RNTI. The FullI-RNTI is a 40-bit string that is configured to the UE during an RRC suspension procedure. For example, according to 3GPP NR Specification #TS38.331, the FullI-RNTI could be configured in the SuspendConfig field of a RRCRelease information element (IE), which is configured to the UE for suspension of the RRC connection and transition of the UE from the RRC_CONNECTED state to the RRC_INACTIVE state.

In the case that the UE ID included in a paging record matches the UE's Fulll-RNTI, then the UE may initiate an RRC connection resumption procedure. The RRC connection resumption procedure could depend on the access type configured for the UE.

If the UE is configured by upper layers of the network with access identity 1, then the RRC connection resumption procedure may be set to multimedia priority service (MPS)—priority access. For example, according to 3GPP NR Specification #TS38.331, the resumeCause field may be set to mcs-PriorityAccess.

If the UE is configured by upper layers of the network with access identity 2, then the RRC connection resumption procedure may be set to mission critical service (MSC)—priority access. For example, according to 3GPP NR Specification #TS38.331, the resumeCause field may be set to msc-PriorityAccess.

If the UE is configured by upper layers of the network with any of access identities 11 to 15, then the RRC connection resumption procedure may be set to high priority access. For example, according to 3GPP NR Specification #TS38.331, the resumeCause field may be set to highPriorityAccess.

For other access identities, the RRC connection resumption procedure may be set to mobile terminated (MT) access. For example, according to 3GPP NR Specification #TS38.331, the resumeCause field may be set to mt-Access.

In the case that the UE ID included in a paging record does not match the UE's Fulll-RNTI, but instead matches another ID allocated to the UE by the network, then the UE may forward the UE's particular ID and an access type, if present, to the upper layers of the UE. Upon going to the RRC_IDLE state, the UE may perform the actions specified in 3GPP NR Specification #TS38.331 with release cause set to "other". An example of the other ID allocated to the UE by upper layers of the network is the 5G-S-TMSI.

Conventional control signaling mechanisms do not support (non-paging) DL data transmission to a UE or data transmission from a UE in an inactive state, except for transmissions that are done as part of a state transition procedure from an inactive to connected state. According to these conventional control signaling mechanisms, when a UE is in an inactive state and is not performing a procedure for connection resumption, the only DCI format that the UE monitors is the paging DCI. For example, the only DCI format that a UE in the RRC_INACTIVE state monitors is DCI format 1_0 having a CRC scrambled by the P-RNTI. However, a conventional paging DCI does not support:
  non-paging DL data scheduling;
  notifications for non-paging DL data scheduling;
  SL data scheduling; or
  UL data scheduling.

Aspects of the present disclosure provide control signaling mechanisms to support data transmission to or from a UE in an inactive state.

According to one aspect, a unicast or multicast data transmission is scheduled to or from a UE that is in an inactive state using DCI and an ID that is specific to the UE, or to a group of UEs including at least the UE. This enables direct scheduling of data through the DCI. For the DL, direct scheduling may be faster and more flexible than paging-based scheduling, for example.

Figure 4:
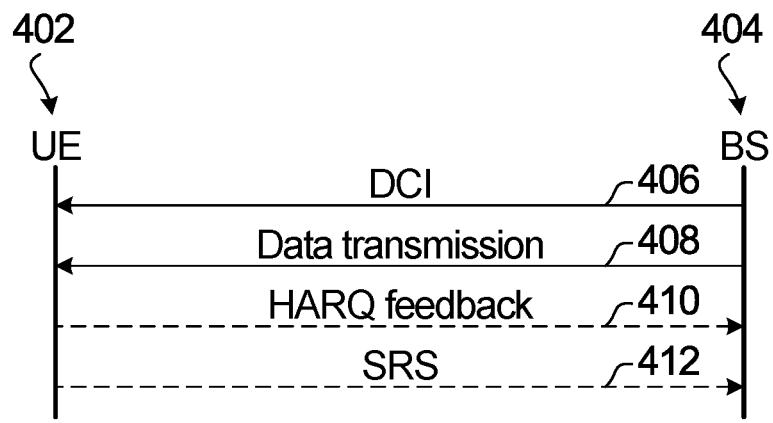
FIGS. 4 to 6 are signaling diagrams illustrating signaling between a base station and a UE in an inactive state, according to aspects of the present disclosure.
Figure 5:
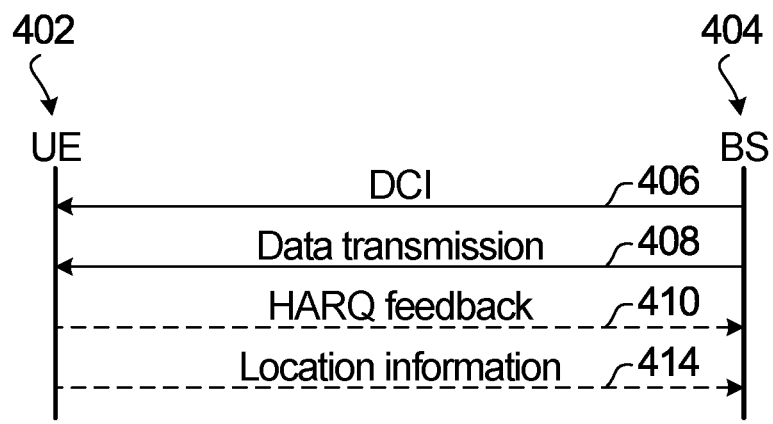
Figure 6:
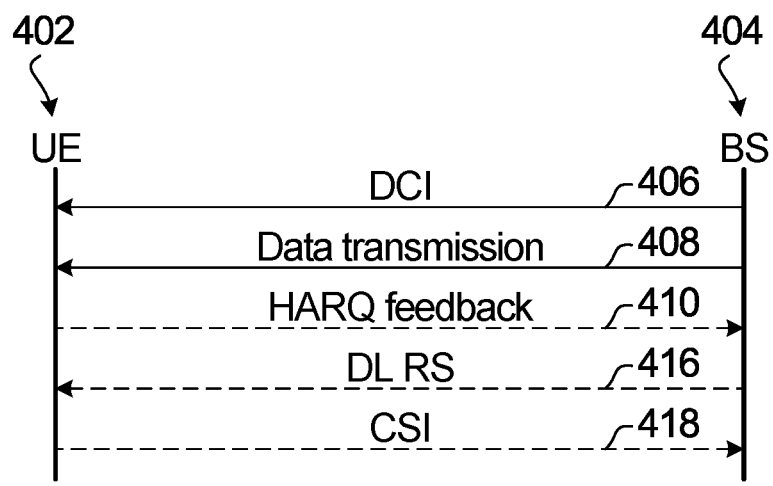

FIGS. 4 to 6 are signaling diagrams illustrating signaling between a base station (BS) 404 and a UE 402 in an inactive state, according to some embodiments. The UE 402 and BS 404 could be similar to the ED 110 and base station 170 of FIGS. 2A and 2B, for example.

FIG. 4 includes DCI 406 transmitted from the BS 404 to the UE 402, a scheduled data transmission 408 transmitted from the BS 404 to the UE 402, optional hybrid automatic repeat request (HARQ) feedback 410 transmitted from the UE 402 to the BS 404, and an optional sounding reference signal (SRS) 412 transmitted from the UE 402 to the BS 404.

The UE 402 is in the inactive state when the DCI 406 is received. The DCI 406 includes a CRC scrambled by a RNTI that is specific to the UE 402. An RNTI that is specific to a particular UE, or to a particular group of UEs, and is used when the UE(s) are in the inactive state is referred herein to as an "I-RNTI". Optionally, an I-RNTI is associated with or specific to the inactive state. If the I-RNTI is specific to the inactive state, then the I-RNTI is not used to scramble the CRC of DCI for the UE or the particular group of UEs in a connected or idle state. In some implementations, the UE 402 is in the RRC_INACTIVE state and the DCI 406 is in the DCI format 1_0. The DCI 406 includes a CRC that is scrambled by the I-RNTI of the UE 402. The I-RNTI is different from the P-RNTI, and is not used to scramble the CRC of DCI when the UE 402 is in the RRC_CONNECTED or RRC_IDLE states.

A UE in an inactive state monitors for DCI having a CRC scrambled by its own I-RNTI. The UE stores its own I-RNTI, and therefore this UE is able to descramble the CRC, and use the CRC to check if decoding of the DCI was successful. In the case that an I-RNTI is specific to a particular UE, any other UEs in the same network or service area will have a different I-RNTI. The other UEs might not store the I-RNTI of the particular UE, and therefore the other UEs might not be able to descramble the CRC of the DCI. Even if one of the other UEs does know the I-RNTI of the particular UE, this other UE should ignore DCI having a CRC scrambled by the I-RNTI of the particular UE.

In some embodiments, an I-RNTI is configured for a UE during a connection setup procedure, or when the UE is in a connected state. For example, the I-RNTI could be configured as part of the RRC connection setup. Alternatively, the I-RNTI could be configured in pdcch-ServingCellConfig or PDCCH-Config in a DL bandwidth part (BWP) configuration in NR. In some other embodiments, an I-RNTI is configured for a UE during a connection suspension procedure. After the I-RNTI is configured, the UE stores the I-RNTI for use in the inactive state.

In some embodiments, an I-RNTI is based on another identifier that is specific to the UE. The network could use this other identifier to determine and configure the I-RNTI, or the UE could determine the I-RNTI itself based on the other identifier and a predetermined rule. Denoting by m the size of (i.e., the number of bits of) an I-RNTI, non-limiting examples of I-RNTIs that are based on other identifiers include:
  m bits that are from, or a function of, a 40-bit Fulll-RNTI configured to the UE during a RRC suspension procedure (for example, in SuspendConfig in the RRCRelease IE). The m bits can be the m most significant bits (MSBs) or the m least significant bits (LSBs), or m bits based on a predefined or preconfigured selection pattern.
  m bits that are from, or a function of, a 24-bit Shortl-RNTI configured to the UE during a RRC suspension procedure (for example, in SuspendConfig in the RRCRelease IE). The m bits can be the m MSBs or the m LSBs, or m bits based on a predefined or preconfigured selection pattern.

m bits that are from, or a function of, a 48-bit next generation 5G system architecture evolution temporary mobile station identifier (NG-5G-S-TMSI). The m bits can be the m MSBs or the m LSBs, or m bits based on a predefined or preconfigured selection pattern.

m bits based on the UE's MAC identifier, or a combination of UE's MAC identifier and network resource identifiers, sleep cycle group information or paging cycle groups.

In some embodiments, the size of an I-RNTI is 16 bits, i.e., m=16. In some embodiments, the size of an I-RNTI is equal to the number of CRC bits of the DCI. As an example, the size of both an I-RNTI and CRC is 16 bits. In some embodiments, to increase the number of UEs that can be addressed by the I-RNTI, and therefore increase the number of UEs that can be reached by the DCI while they are in an inactive state, a number of bits larger than the CRC size can be used for an I-RNTI. In a particular embodiment, a portion of the I-RNTI bits is used to scramble the CRC of the DCI by the BS (and descramble the CRC by the UE) and the rest of the I-RNTI bits are included as a bit field in the DCI content. As an example, the 24-bit ShortI-RNTI configured to the UE during a RRC suspension procedure can be used as an I-RNTI, 16 bits of which are used for scrambling the CRC of the DCI, and the 8 remaining bits are included as a bit field in the DCI content.

Figure 7A:
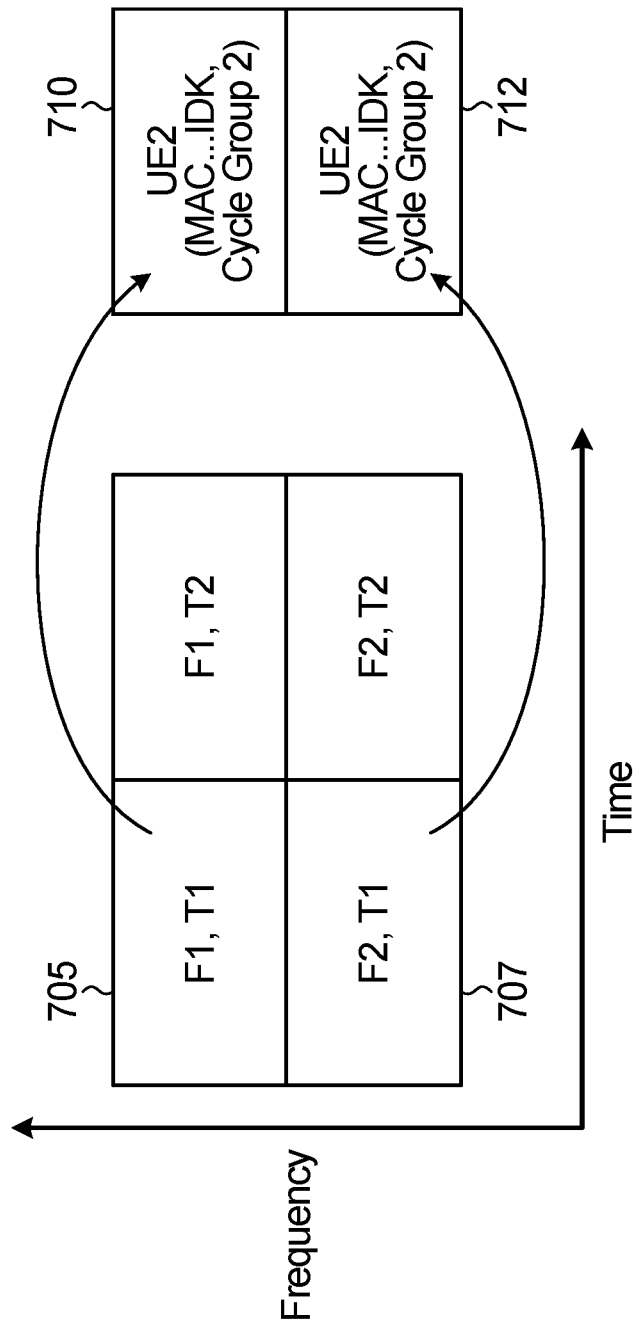
FIG. 7A illustrates a first example UE identifier that is a combination of a medium access control (MAC) identifier and network resource information.

FIG. 7A illustrates a first example UE identifier that is a combination of a MAC identifier and network resource information. The first example UE identifier may be used to identify UEs while they are in an inactive state. An example network resource diagram is shown in FIG. 7A highlighting four network resources identified by their time resource identifier and frequency resource identifier. As an example, network resource 705 is identified by its frequency resource identifier F1 and time resource identifier T1, and network resource 707 is identified by its frequency resource identifier F2 and time resource identifier T1.

The first example UE identifier may be expressed as a combination of a UE's MAC identifier and network resource identifiers. As shown in FIG. 7A, the UE identifier for a first UE assigned network resource 705 is (MAC_IDK, F1, T1) 710 and for a second UE assigned network resource 707 is (MAC_IDK, F2, T1) 712, where MAC_IDK is the MAC identifier assigned to both first UE and second UE for use in the inactive state. The combination of the MAC identifier with the network resource identifiers allows the reuse of a MAC identifier with different UEs.

Figure 7B:
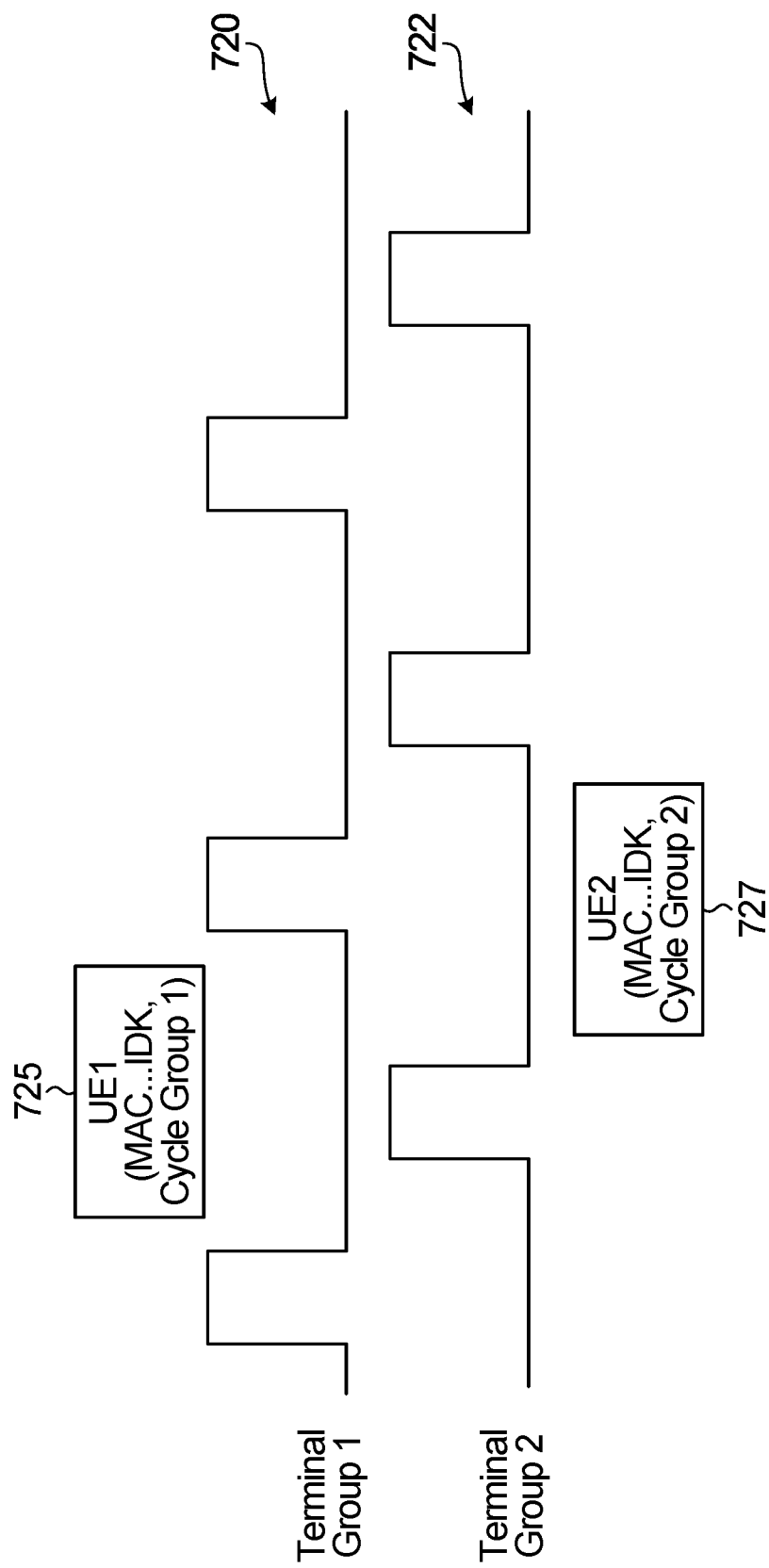
FIG. 7B illustrates a second example UE identifier that is a combination of a MAC identifier and sleep cycle group information.

FIG. 7B illustrates a second example UE identifier that is a combination of a MAC identifier and sleep cycle group information. The second example UE identifier may be used to identify UEs while they are in an inactive state. A first trace 720 and second trace 722 are shown in FIG. 7B illustrating paging cycle groups for UEs, with high periods representing when UEs in a particular paging cycle group may monitor a paging channel.

The second example UE identifier may be expressed as a combination of a UE's MAC identifier and its sleep cycle group information. As shown in FIG. 7B, the UE identifier for a first UE of a first paging cycle group is (MAC_IDK, cycle group 1) 725 and the UE identifier for a second UE of a second paging cycle group is (MAC_IDK, cycle group 2) 727, where MAC_IDK is the MAC identifier assigned to both first UE and second UE when they were in an active state.

Referring again to the DCI 406 of FIG. 4, the DCI includes a resource assignment or a resource assignment bit field for the data transmission 408. In this way, the DCI 406 could be or include a notification of data scheduling. The resource assignment could be referred to as "bit field group #1". As the DCI 406 includes a CRC that is scrambled by the I-RNTI for the UE 402, the resource assignment is specific to the UE 402. The resource assignment includes bit fields to enable the direct scheduling of data in the inactive state. This enables relatively fast and dynamic data scheduling for the UE 402. For example, only one transmission (the DCI 406) is needed to inform the UE 402 of the scheduled data transmission 408. The UE 402 is not required to read a paging message, or any other additional message, to learn of the scheduled data transmission 408.

Based on the resource assignment, the UE 406 could receive the scheduled data transmission 408 on a physical shared channel. An example of a physical shared channel is the PDSCH. The UE 402 is in the inactive state when the data transmission 408 is received.

The data transmission 408 is illustrated as a unicast transmission. In some embodiments, the data transmission 408 is instead a multicast data transmission, in which case, the I-RNTI is configured or specific to a group of UEs, including the UE 402. Each UE in the group of UEs may be able to descramble the CRC, obtain the content of the received DCI, and receive the scheduled data transmission. The group of UEs includes some, but not all, of the UEs that are an in an inactive state in the network or coverage area, for example. Other UEs that are not in the group of UEs might not be able to descramble the CRC and obtain the content of the received DCI.

Although illustrated as a DL transmission, the data transmission 406 could instead be an UL or SL transmission. An UL transmission could be transmitted by the UE 402 to the BS 404 on the physical UL shared channel (PUSCH), and a SL transmission could be transmitted or received by the UE on the physical SL shared channel (PSSCH). For scheduling a SL transmission, sidelink control information (SCI) may be transmitted in a physical sidelink control channel (PSCCH), in which case the I-RNTI of the receiving UE may be used by the transmitting UE to scramble the CRC of the SCI. Alternatively, for scheduling a SL transmission, a portion of the bits of the I-RNTI of the receiving UE may be used by the transmitting UE to scramble the CRC of the SCI, and the remaining bits of the I-RNTI may be included as a bit field in the SCI content.

In some implementations, the resource assignment in the DCI 406 includes a frequency domain resource assignment. The frequency domain resource assignment could indicate the RBs that the UE 402 should monitor for the data transmission 408. The RBs indicated by the frequency domain resource assignment can be virtual RBs (VRBs), in which case a VRB-to-PRB mapping is used by the UE to obtain the PRBs that are scheduled for the data transmission 408. Both non-interleaved and interleaved VRB-to-PRB mapping schemes could be supported, or alternatively, only non-interleaved VRB-to-PRB mapping schemes could be supported. In embodiments where both non-interleaved and interleaved mapping schemes are supported, the mapping scheme is configured to the UE by higher layers when the UE is in a connected state. In this case, if no mapping scheme is indicated, the UE may assume non-interleaved mapping. In a non-interleaved VRB-to-PRB mapping, VRB n is mapped to PRB n, where n is an integer. In an interleaved VRB-to-PRB mapping, RBs (both VRBs and PRBs) are divided into a number of RB bundles (VRB bundles and PRB bundles, respectively). An RB bundle consists of a number of contiguous RBs. The RB bundle size could be pre-specified or configured by higher layers. VRB bundle j is mapped to PRB bundle f(j), where f(j) is a predefined interleaving function and j is an integer. In an example, for DL data scheduling in the inactive state, the frequency domain resource assignment is a type 1 resource indicator value (RIV)-based resource assignment that is $\lceil \log_2(N_{RB}^{DL,BWP}(N_{RB}^{DL,BWP}+1)/2) \rceil$ bits in length. The value of $N_{RB}^{DL,BWP}$ can be chosen in any of various different ways, which include but are not limited to:

- $N_{RB}^{DL,BWP}$ is the size of CORESET 0;
- $N_{RB}^{DL,BWP}$ is the size of the initial DL BWP configured to the UE 402 when in a connected state;
- $N_{RB}^{DL,BWP}$ is the size of the active DL BWP of the UE 402, in which the UE received a RRCRelease message in a connected state to suspend the RRC connection; and
- $N_{RB}^{DL,BWP}$ is a configured or preconfigured size for DL data transmission in the inactive state (for example, the size of a DL BWP configured to the UE 402 for DL communication in the inactive state).

In an example, for UL data scheduling in the inactive state, the frequency domain resource assignment is a type 1 resource indicator value (RIV)-based resource assignment that is $\lceil \log_2(N_{RB}^{UL,BWP}(N_{RB}^{UL,BWP}+1)/2) \rceil$ bits in length. The value of $N_{RB}^{UL,BWP}$ can be chosen in any of various different ways, which include but are not limited to:

- $N_{RB}^{UL,BWP}$ is the size of the initial UL BWP configured to the UE 402 when in a connected state;
- $N_{RB}^{BWP}$ is the size of the active UL BWP of the UE 402, which was active when the UE received a RRCRelease message in a connected state to suspend the RRC connection; and
- $N_{RB}^{UL,BWP}$ is a configured or preconfigured size for UL data transmission in the inactive state (for example, the size of a UL BWP configured to the UE 402 for UL communication in the inactive state).

In an example, for SL data scheduling in the inactive state, the frequency domain resource assignment is a type 1 resource indicator value (RIV)-based resource assignment that is $\lceil \log_2(N_{RB}^{SL,BWP}(N_{RB}^{SL,BWP}+1)/2) \rceil$ bits in length. The value of $N_{RB}^{SL,BWP}$ can be chosen in any of various different ways, which include but are not limited to:

- $N_{RB}^{SL,BWP}$ is the size of the active SL BWP of the UE 402, which was active when the UE received a RRCRelease message in a connected state to suspend the RRC connection; and
- $N_{RB}^{SL,BWP}$ is a configured or preconfigured size for SL data transmission in the inactive state (for example, the size of a SL BWP configured to the UE 402 for SL communication in the inactive state).

In some implementations, the resource assignment in the DCI 406 includes a time domain resource assignment. The time domain resource assignment could indicate the slots and/or subframes that the UE 402 should monitor for the data transmission 408. In an example, the time domain resource assignment includes 4 bits that indicate a row index in a resource assignment table.

In some implementations, the resource assignment in the DCI 406 includes a VRB-to-PRB mapping, a MCS and/or a TB scaling field. For example, the resource assignment could include any or all of the following bit fields:

- VRB-to-PRB mapping—1 bit in length, which indicates the VRB-to-PRB mapping scheme (interleaved or non-interleaved) used for the scheduled data transmission;
- MCS—5 bits indicating a row index in an MCS table (for example, Table 5.1.3.1-1 of 3GPP NR Specification #TS38.214); and
- TB scaling—2 bits indicating a row index in a predefined TB scaling table.

An example of a TB scaling table is provided in Table 1 below.

TABLE 1

A TB scaling table according to an embodiment

| Bit field | TB scaling factor |
| --- | --- |
| 00 | 1 |
| 01 | 0.5 |
| 10 | 0.25 |
| 11 | Reserved |

In some implementations, the DCI 406 includes a messaging bit field, which could be referred to as "bit field group #2". The messaging bit field includes a short message indicator that indicates whether or not the DCI 406 includes a short message for the UE 402. In an example, the short message indicator is 1 bit indicating a row index in a short message indicator table. Table 2 provided below is an example of a short message indicator table.

TABLE 2

A short message indicator table according to an embodiment

| Bit Field | Short Message Indicator |
| --- | --- |
| 0 | Only scheduling information for the unicast/multicast data transmission is present in the DCI |
| 1 | Both scheduling information for the unicast/multicast data transmission and short message are present in the DCI |

If the short message indictor indicates that a short message is included in the DCI 406, then the UE 402 will proceed to read the short message. In an example, a short message bit field of the DCI 406 includes 8 bits that are used to indicate row indices of a short message table. The rows of the short message table could include possible short messages for the UE 402. An example of a short message table is Table 6.5-1 of the of 3GPP NR Specification #TS38.331, which is shown in Table 3 below.

TABLE 3

Table 6.5-1 of the of 3GPP NR Specification # TS38.331

| Bit | Short Message |
| --- | --- |
| 1 | systemInfoModification<br>If set to 1: indication of a broadcast channel (BCCH) modification other than SIB6, SIB7 and SIB8. |
| 2 | etwsAndCmasIndication<br>If set to 1: indication of an earthquake and tsunami warning system (ETWS) primary notification and/or an ETWS secondary notification and/or a commercial mobile alert service (CMAS) notification. |
| 3-8 | Not used in this release of the specification, and shall be ignored by UE if received. |

Alternatively, if the if the short message indictor indicates that a short message is not included in the DCI 406, then the bits of the short message bit field are reserved.

In some implementations, the DCI 406 includes an indication of a HARQ process associated with the data transmission 408. This indication could be provided by HARQ-related bit fields referred to as "bit field group #3". In an example, an indication of a HARQ process could include any or all of the following:

New data indicator—1 bit indicating if the failed transmission was a first transmission or a retransmission;
Redundancy version—2 bits indicating a row index in an redundancy version (RV) table (for example, Table 7.3.1.1.1-2 of 3GPP NR Specification #TS38.212);
HARQ process number—4 bits in length;
Transmit power control (TPC) command for scheduled PUCCH—2 bits indicating a row index in a TPC command table;
PUCCH resource indicator—3 bits in length; and
PDSCH-to-HARQ feedback timing indicator—3 bits indicating a row index in a table for mapping a PDSCH-to-HARQ feedback timing indicator value to numbers of time units.

Using the indication of the HARQ process associated with the data transmission 408, the UE 402 can transmit the HARQ feedback 410 to the BS 404. For example, if the UE 402 fails to successfully receive and decode the data transmission 408, then the UE 402 could transmit a non-acknowledgment according to the HARQ process associated with the data transmission 408.

A HARQ process might not be configured for every data transmission from the BS 404 to the UE 402, and therefore the DCI 406 might not include an indication of a HARQ process in all implementations.

In some implementations, the DCI 406 includes, in measurement-related bit fields, one or more measurement requests or triggers. The measurement-related bit fields may be referred to as "bit field group #4". Non-limiting examples of these measurement requests include:
Sounding reference signal (SRS) request—2 bits indicating a row in an SRS request table;
Channel state information (CSI) request—Up to 6 bits in length (the number of bits may be configured by higher layers of the network, for example); and
Location information request—1 bit indicating a row in a location information table.

An example of a location information table is provided in Table 4 below.

TABLE 4

A location information table according to an embodiment

| Bit | Location information type |
|---|---|
| 0 | Mobility tracking information such as GPS information |
| 1 | Location prediction information |

Measurement requests are used by the BS 404 and/or the network to obtain measurement-related information. Examples of measurement-related information include uplink SRSs, measurement from downlink pilots and/or data, uplink data, mobility tracking information such as GPS information, and location prediction information. This measurement-related information may be used to determine where the UE 402 is located and/or the channel quality for the UE, and data can be transmitted to the UE accordingly. In some implementations, a measurement request can request measurement related information on a periodic basis.

It is to be understood that the BS 404 might not need to receive any measurement related information. It may be sufficient to rely on previous measurement related information, for example, if the wireless device is not moving. Also, if the data can be transmitted with a predefined MCS, then measurement related information may be unnecessary. Thus, the DCI 406 may not include a measurement request.

As illustrated in FIG. 4, an optional SRS 412 is transmitted from the UE 402 to the BS 404. The SRS 412 could be transmitted in response to an SRS request included in the DCI 406.

FIGS. 5 and 6 illustrate other examples of signaling between the UE 402 and BS 404. Similar to FIG. 4, FIG. 5 includes the DCI 406 transmitted from the BS 404 to the UE 402, the data transmission 408 transmitted from the BS 404 to the UE 402, and the optional HARQ feedback 410 transmitted from the UE 402 to the BS 404. In addition, FIG. 5 includes an optional transmission of location information 412 from the UE 402 to the BS 404. The location information could include GPS or location prediction information, and could be transmitted in response to a location information request in the DCI 406, for example.

FIG. 6 also includes the DCI 406 transmitted from the BS 404 to the UE 402, the data transmission 408 transmitted from the BS 404 to the UE 402, and the optional HARQ feedback 410 transmitted from the UE 402 to the BS 404. FIG. 6 further includes an optional DL reference signal (RS) 416 transmitted from the BS 404 to the UE 402, and optional CSI 418 transmitted from the UE 402 to the BS 404. The UE 402 determines the CSI 418 based on a measurement of the DL RS. The reception of the DL RS 416, and the generation and transmission of the CSI 418, could be performed in response to a CSI request in the DCI 406, for example.

The orders of the transmissions shown in FIGS. 4 to 6 are provided by way of example, and should not be considered limiting in any way. Other orders of transmissions are also contemplated. For example, the UE 402 could transmit the SRS 412 before the BS 404 transmits the data transmission 408.

In general, DCI that includes a CRC scrambled by an I-RNTI could be formatted in a variety of different ways. In some embodiments, the format of a DCI having a CRC scrambled by an I-RNTI includes only a resource assignment, and does not include a short message, an indication of a HARQ process or a measurement request. For example, this DCI might only include bit field group #1 defined above.

In some embodiments, the format of DCI having a CRC scrambled by an I-RNTI includes a resource assignment and a short message, and does not include an indication of a HARQ process or a measurement request. For example, this DCI might only include bit field groups #1 and #2 defined above.

In some embodiments, the format of DCI having a CRC scrambled by an I-RNTI includes a resource assignment and an indication of a HARQ process, and does not include a short message or a measurement request. For example, this DCI might only include bit field groups #1 and #3 defined above.

In some embodiments, the format of DCI having a CRC scrambled by an I-RNTI includes a resource assignment, an indication of a HARQ process and a measurement request, and does not include a short message. For example, this DCI might only include bit field groups #1, #3 and #4 defined above.

Other formats of DCI having a CRC scrambled by an I-RNTI are also contemplated.

Although not shown in FIGS. 4 to 6, the UE 402 could also receive other DCI in addition to the DCI 406. The other DCI could be received before or after the DCI 406. In general, the UE 402 may monitor a paging search space and perform blind decodings of the paging PDCCH. In each blind decoding, UE 402 tries to descramble the CRC of the DCI in the paging PDCCH using both the P-RNTI and I-RNTI. If neither the P-RNTI nor I-RNTI passes the CRC check, then the UE 402 proceeds to the next blind decoding attempt in the same paging search space. The UE 402 continues until, in a blind decoding attempt, the CRC check is passed after descrambling by either the I-RNTI or P-RNTI. At that point, UE 402 proceeds to read the DCI content and follow the corresponding DCI command(s). In some implementations, UE 402 may temporarily stop blind decoding of the paging search space to perform actions based on the corresponding DCI command(s).

In some implementations, the DCI 406 is size-matched with the other DCI that may be received by the UE 402. For example, the DCI 406 can be size-matched with paging DCI. As noted above, an example of paging DCI is DCI format 1_0 having a CRC scrambled by the P-RNTI. When the DCI 406 is size-matched with the paging DCI, the DCI 460 and paging DCI will have the same number of bits after the size-matching. A possible benefit of size-matching is avoiding an increase in the complexity of blind decodings on the PDCCH. In some embodiments, to match the size of first DCI (referred to as "DCI X") to the size of second DCI (referred to as "DCI Y"), a first size of DCI Y is determined according to its DCI format and other possible size-matchings of DCI Y, and matching of the size of DCI X to the size of DCI Y is performed as follows:

If the number of information bits in DCI X prior to padding is less than the payload size of DCI Y, then a number of zero padding bits are generated for DCI X until the payload size equals that of DCI Y.

If the number of information bits in DCI X prior to truncation is larger than the payload size of DCI Y, the bitwidth of the frequency domain resource assignment field in DCI X is reduced by truncating a number of most significant bits such that the size of DCI X equals the size of DCI Y.

In a particular example for size-matching the DCI 406 of FIG. 4, DCI X discussed above is the DCI 406, and DCI Y discussed above is paging DCI (not shown). In another example for size-matching the DCI 406, DCI X is the DCI 406, and DCI Y is DCI 1_0 (not shown) monitored in a common search space.

In some embodiments, the DCI 406 may be monitored in the same search space as the paging DCI, i.e., in the paging search space. As an example, the UE follows the paging occasions to monitor the DCI 406 and/or to receive the data scheduled by the DCI 406. A possible benefit of this is to limit the blind decoding attempts which are done by the UE when the UE is in inactive state, and to achieve further power savings compared to embodiments where the DCI 406 and the paging DCI are monitored in different search spaces or the UE monitors the DCI 406 in time durations beyond its paging occasions.

In some implementations, resource block (RB) scaling may be applied to achieve scheduling of a larger BWP size than the BWP size used to determine a frequency domain resource assignment for DCI. For example, when the parameter $N_{RB}^{DL,BWP}$ is used to determine a frequency domain resource assignment for DCI, and $N_{RB}^{DL,BWP}$ is smaller than the size of the inactive DL BWP, RB scaling may be applied. As an example of a RB scaling mechanism, consider the size of the inactive DL BWP denoted by $N_{RB}^{Inactive,BWP}$. The RIV indicated by the frequency domain resource assignment in the DCI corresponds to a starting RB, $RB_{start}=0$, K, 2K, . . . , $(N_{RB}^{DL,BWP}-1)K$, and a length in terms of contiguously allocated RBs, $L_{RBs}=K, 2K, \ldots, N_{RB}^{DL,BWP}K$. The RIV is defined by:

If $(L'_{RBs}-1) \leq \lfloor N_{RB}^{DL,BWP}/2 \rfloor$ then $RIV = N_{RB}^{DL,BWP}(L'_{RBs}-1)+RB'_{start}$ else $RIV = N_{RB}^{DL,BWP}(N_{RB}^{DL,BWP}-L'_{RBs}+1)+N_{RB}^{DL,BWP}-1-RB'_{start}$.

Here, $L'_{RBs}=L_{RBs}/K$, $RB'_{start}=RB_{start}/K$ and $L'_{RBs} \leq N_{RB}^{DL,BWP}-RB'_{start}$. If $N_{RB}^{Inactive,BWP} > N_{RB}^{DL,BWP}$, K equals the maximum power of 2 which satisfies $K \leq \lfloor N_{RB}^{Inactive,BWP}/N_{RB}^{DL,BWP} \rfloor$; otherwise K=1.

According to an aspect of the present disclosure, a unicast or multicast data transmission to or from a UE in an inactive state is scheduled through paging using an indication in paging DCI. The UE can be notified of the data transmission using the indication in the paging DCI. The data transmission can then be received in a paging message or in a further transmission that is scheduled by a paging message. A possible benefit of using paging DCI to provide an indication that a data transmission is scheduled is that the indication information conveyed by this paging DCI is not understandable by legacy UEs, i.e., UEs that do not support unicast or multicast data transmission through paging. Therefore, a legacy UE, after successfully decoding the paging DCI, might not try to receive the paging message, and thus, may save power and battery life.

Using paging DCI to provide an indication that a data transmission is scheduled is an example of indirect scheduling. Because a UE in an inactive state might already receive and decode paging DCI, implementing an indication that a data transmission is scheduled using the paging DCI might not increase PDCCH decoding performance or complexity.

Figure 8:
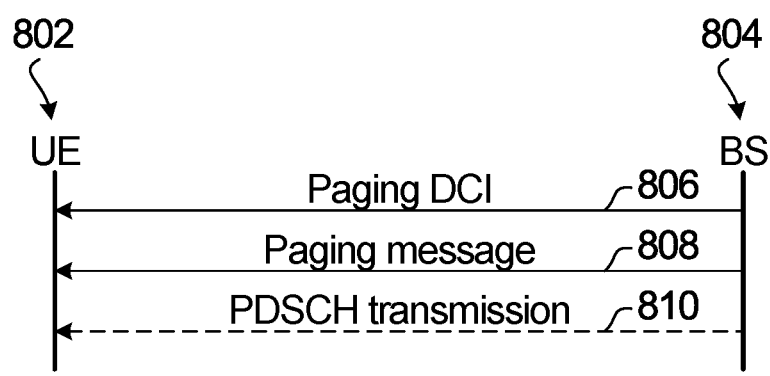
FIG. 8 is a signaling diagram illustrating signaling between a base station and a UE in an inactive state, according to further aspects of the present disclosure.

FIG. 8 is a signaling diagram illustrating signaling between a BS 804 and a UE 802 in an inactive state, according to some embodiments. The UE 802 and BS 804 could be similar to the ED 110 and base station 170 of FIGS. 2A and 2B, for example.

FIG. 8 includes paging DCI 806 transmitted from the BS 804 to the UE 802, a paging message 808 transmitted from the BS 804 to the UE 802 in a paging PDSCH, and an optional PDSCH transmission 810 from the BS 804 to the UE 802. The UE 802 may receive the paging DCI 806, the paging message 808 and optionally the PDSCH transmission 810 while in the inactive state.

The paging DCI 806 includes a CRC scrambled by the P-RNTI, and an indication that a unicast or multicast data transmission is scheduled. This data transmission is scheduled to the UE 802 on the DL. UEs in an idle or inactive state store the P-RNTI, and therefore the UE 802 is able to descramble the CRC to determine if decoding the paging DCI 806 was successful.

Any of various bit fields of the paging DCI 806 could be used to provide the indication that the data transmission is scheduled. In some implementations, these bit fields are reinterpretations of bit fields that were previously or conventionally reserved in paging DCI. For example, bit fields of DCI format 1_0 having a CRC scrambled by the P-RNTI could be reinterpreted to provide an indication that a data transmission is scheduled.

In some embodiments, a short message indicator bit field of paging DCI is used to indicate data scheduling. Conventionally, for DCI format 1_0 having a CRC scrambled by the P-RNTI, the bit combination "00" in the short message indicator bit field was reserved. In some embodiments, this bit combination is reinterpreted as an indicator for data scheduling. An example of a short message indicator table that designates the bit combination "00" for DL data scheduling is provided below. In this example, a UE that supports unicast or multicast DL data transmission through paging, after reading the short message indicator bit field of "00", determines that the scheduled paging message corresponds to a unicast or multicast DL data transmission. However, a UE that does not support unicast or multicast DL data transmission through paging, after reading the short message indicator bit field of "00", may ignore the paging DCI, and thus save power and battery life by avoiding decoding of the scheduled paging message.

TABLE 5

An example of a short message indicator table according to an embodiment

| Bit field | Short Message indicator |
| --- | --- |
| 00 | Scheduling unicast or multicast DL data |
| 01 | Only scheduling information for paging is present in the DCI |
| 10 | Only short message is present in the DCI |
| 11 | Both scheduling information for paging and short message are present in the DCI |

In some embodiments, a short message bit field of paging DCI is used to indicate data scheduling. By way of example, a short message indicator bit field could indicate to a UE that a short message is present, and the short message could be used to indicate DL data scheduling. For a short message indicator bit field having 2 bits, either of the bit combinations "10" and "11" could be used to indicate that a short message is included in the paging DCI. The short message bit field could include a single bit that indicates whether or not a data transmission to the UE is scheduled. Referring to the short message table shown in Table 3 as an example, any or all of the bits 3 to 8 could be used to indicate that a data transmission is scheduled. This could be considered a reinterpretation of previously or conventionally reserved short message bit fields.

In some embodiments, a bit field other than the short message indicator bit field and the short message bit field of paging DCI is used to indicate data scheduling. For example, one of the reserved bits in DCI format 1_0 having a CRC scrambled by the P-RNTI could be used to indicate that a data transmission is scheduled. This could be considered a reinterpretation of previously or conventionally reserved DCI bit fields.

It should be noted that the paging DCI 806 might not indicate which UE the data transmission is scheduled for. For example, when the UE 802 receives the paging DCI 806 and determines that the data transmission is scheduled, the UE might not know at this time that the data transmission is for the UE. Similar comments apply to other UEs that are monitoring a paging search space and receive the paging DCI 806. An indication that the data transmission is scheduled for the UE 802 could be provided in the paging message 808.

The paging DCI 806 includes a resource assignment for the paging message 808. An example of a resource assignment for a paging message that is included in DCI format 1_0 having a CRC scrambled by the P-RNTI is provided above.

Upon receiving the paging message 808, the UE 402 reads a paging record in the paging message. If a UE ID that has been assigned to the UE 402 is listed in the paging record, then the UE could determine that the data transmission is scheduled to the UE. A further UE that receives the paging message 808 but does not see its UE ID in the paging record would determine that the data transmission was not scheduled for the further UE.

In some implementations, the data transmission is included in the paging message 808, and therefore the UE 802 receives the data transmission in the paging message. In these implementations, the PDSCH transmission 810 is not required to perform the data transmission and can be omitted.

In other implementations, the paging message 808 includes a resource assignment for the data transmission. This resource assignment corresponds to the PDSCH transmission 810, which contains the data transmission. The UE 802 receives the resource assignment in the paging message 808, and receives the data transmission in the PDSCH transmission 810. Receiving the PDSCH transmission 810 may or may not require a transition of the UE 802 from the inactive state to a connected state.

In some implementations, the paging message 808 includes an indication of whether or not the data transmission is larger than a predetermined threshold. This indication could be a single bit of the paging message 808, and in particular implementations, be a single bit in each paging record included in the paging message 808. If the data transmission is less than the threshold, then the data transmission could be considered a small data transmission. If the data transmission is larger than the threshold, then the data transmission could be considered a large data transmission. The indication of whether or not the data transmission is larger than a predetermined threshold could impact the behavior of the UE 802 when decoding the paging message 808.

A small data transmission could be included in the paging message 808. Therefore, when the UE 802 learns that the data transmission is small, the UE could proceed to decode the paging message 808 to receive the data transmission. Alternatively, when the data transmission is a large data transmission, the data transmission might not fit within the paging message 808. Accordingly, the paging message 808 could include a resource assignment for the PDSCH transmission 810. When the UE 802 learns that the data transmission is large, the UE could proceed to decode the paging message 808 to receive the resource assignment for the PDSCH transmission 810, and subsequently, decode the PDSCH transmission 810 according to the received resource assignment.

The paging message 808, and in particular implementations, each paging record included in the paging message 808, could include an indication of whether the paging message 808 includes a resource assignment for the data transmission or the data transmission itself. This indication can be provided regardless of whether the data transmission is small or large. Therefore, when the UE 802 learns that the paging message 808 includes the data transmission, the UE could proceed to decode the paging message 808 to receive the data transmission. Alternatively, when the UE 802 learns that the paging message 808 includes a resource assignment for the data transmission, the UE could proceed to decode the paging message 808 to receive the resource assignment for the PDSCH transmission 810, and subsequently decode the PDSCH transmission 810 according to the received resource assignment.

In some embodiments, the PDSCH transmission 810 could instead be a PUSCH transmission or a PSSCH transmission. For example, the paging message 808 could include a resource assignment for a data transmission from the UE

802 on the UL. Alternatively, the paging DCI 806 could be paging SL control information (SCI), and the paging message 808 could include a resource assignment for a data transmission to or from the UE 802 on the SL.

According to an aspect of the present disclosure, a unicast or multicast data transmission to or from a UE in an inactive state is scheduled through paging, without any indication of the unicast or multicast data transmission in paging DCI. A possible benefit of this aspect of the disclosure is to enable the network to use a paging message to page some UEs through normal or legacy paging, and notify other UEs of a unicast or multicast data transmission. Normal or legacy paging could also be considered conventional paging.

In some embodiments, a single bit in each paging record indicates whether the UE, whose UE identity is conveyed in the corresponding paging record, is being paged by normal or legacy paging, or is being scheduled a unicast or multicast data transmission.

In some embodiments, for each UE that is indicated in the paging message as having a scheduled unicast or multicast data transmission, the data transmission is included in the corresponding paging record.

In some embodiments, for each UE that is indicated in the paging message as having a scheduled unicast or multicast data transmission, the resource assignment information for the data transmission may be included in the corresponding paging record. After reading the corresponding paging record, the UE may proceed to receive the DL data (or transmit the UL data) scheduled by the corresponding resource assignment.

In some embodiments, neither the data transmission nor the resource assignment for the data transmission is included in the paging record. A UE that is indicated in the paging message as having a scheduled unicast or multicast data transmission may proceed to monitor and receive a PDCCH. The PDCCH may include DCI with CRC scrambled by I-RNTI (e.g., DCI according to any of the embodiments described above). The UE may then descramble the CRC and decode the DCI, and receive the DL data (or transmit the UL data) scheduled by the DCI. In some embodiments, the PDCCH which includes DCI with CRC scrambled by I-RNTI may be monitored and received in the paging search space set. In some other embodiments, the PDCCH which includes DCI with CRC scrambled by I-RNTI may be monitored and received in a search space set called "inactive unicast/multicast search space set", which is different from the paging search space set. In a particular example, the UE may monitor the "inactive unicast/multicast search space set" in inactive state only if it receives an indication of unicast or multicast data transmission in the paging message as described above.

Further examples of control signaling to support data transmission to or from a UE in an inactive state will now be discussed with reference to FIGS. 9 and 10.

Figure 9:
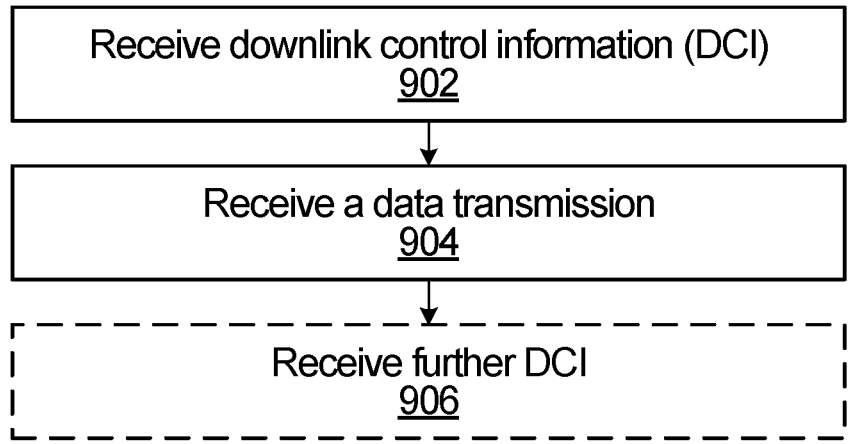
FIGS. 9 and 10 are flow diagrams illustrating methods according to aspects of the present disclosure.

FIG. 9 is a flow diagram illustrating an example method 900. Step 902 includes receiving DCI by a UE in an inactive state. By way of example, the DCI could be DCI format 1_0. The DCI includes a CRC scrambled by a RNTI that is specific to the UE or to a group of UEs, where the group of UEs includes the UE. As noted above, this type of RNTI is also referred to herein as an I-RNTI. Optionally, the RNTI is specific to the inactive state. The UE knows the RNTI, and can use the RNTI to descramble the CRC. The descrambled CRC can then be used to check if decoding the DCI was successful.

In some embodiments, the RNTI is specific to the UE. For example, the group of UEs might include only the UE. Optionally, the RNTI is based on another identifier that is specific to the UE. For example, the RNTI could be based on the UE's FullI-RNTI, ShortI-RNTI, NG-5G-S-TMSI, MAC ID, or a combination of the MAC ID and network resource identifiers, sleep cycle group information or paging cycle groups.

The DCI further includes a resource assignment for a data transmission to the UE. In some implementations, the resource assignment includes at least one of: a frequency domain resource assignment, a time domain resource assignment, a virtual resource block to physical resource bock mapping, a modulation and coding scheme, and a transport block scaling factor. Examples of resource assignment bit fields are provided elsewhere herein.

In some embodiments, the DCI further includes a short message, an indication of a HARQ process associated with the data transmission and/or a measurement request. Examples of short messages, indications of a HARQ processes and measurement requests are provided elsewhere herein.

Step 904 includes receiving, by the UE in the inactive state, the data transmission on a physical shared channel. The resource assignment for the data transmission in the DCI is used to receive the data transmission. The data transmission could be either a DL transmission or a SL transmission, and the physical shared channel could be the PDSCH or the PSSCH.

Optional step 906 includes receiving, by the UE in the inactive state, further DCI. In step 906, the RNTI used to scramble the CRC of the DCI received in step 902 is considered a first RNTI. The further DCI includes a further CRC scrambled by a P-RNTI different from the first RNTI. The UE knows the P-RNTI, and can use the P-RNTI to descramble the further CRC. The descrambled further CRC can then be used to check if decoding the further DCI was successful. The DCI received in step 902 is size-matched with the further DCI received in step 906 to potentially reduce the complexity of blind decodings, for example.

It should be noted that the DCI received in step 902 and the further DCI received at step 906 could be received at different times. For example, the DCI received in step 902 and the further DCI received at step 906 could be received during different PDCCH monitoring occasions or different paging occasions. In addition, the order of steps 902, 906 illustrated in FIG. 9 is provided by way of example. In some cases, step 906 could be performed before step 902.

Figure 10:
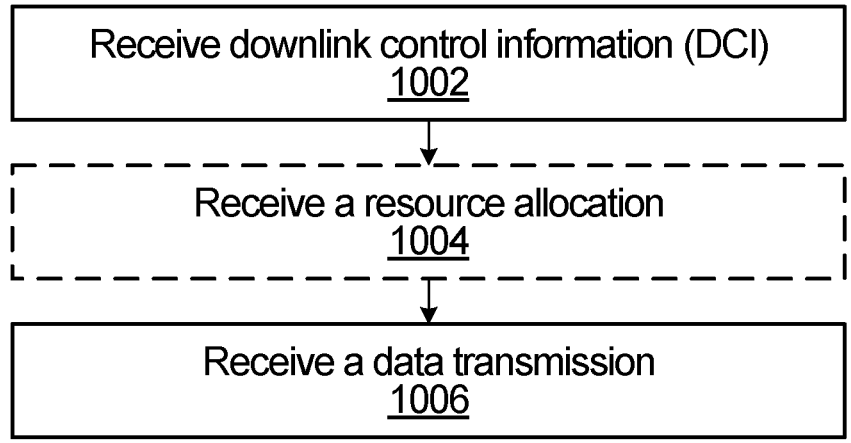

FIG. 10 is a flow diagram illustrating another example method 1000. Step 1002 includes receiving DCI by a UE in an inactive state. By way of example, the DCI could be DCI format 1_0. The DCI includes a CRC scrambled by a P-RNTI, and a resource assignment for a paging message to the UE. The UE knows the P-RNTI, and can use the P-RNTI to descramble the CRC. The descrambled CRC can then be used to check if decoding the DCI was successful.

In some embodiments, step 1002 includes receiving, in the DCI, by the UE in the inactive state, an indication that the data transmission is scheduled. In some embodiments, the indication is in a short message indicator field of the DCI or the indication is in a short message field of the DCI. The indication could be a single bit of the DCI.

The indication that the data transmission is scheduled might not always be received in the DCI. In some embodiments, the UE receives the indication in the paging message.

Optional step 1004 includes receiving, in the paging message on a paging physical downlink shared channel, by the UE in the inactive state, a resource assignment for the data transmission. In step 1004, the UE receives the paging message, where the paging message carries the resource assignment for the data transmission. The resource assignment for the paging message, which is carried in the DCI, is used to receive the paging message.

Step 1006 includes receiving, by the UE in the inactive state, based on the paging message, the data transmission on a physical shared channel. When optional step 1004 is performed, this physical shared channel could be the PDSCH or the PSSCH. In this case, receiving the data transmission based on the paging message includes: (i) receiving the resource assignment for the data transmission in the paging message; and (ii) using the resource assignment to receive the data transmission.

When step 1004 is not performed, step 1006 includes receiving the data transmission in the paging message on a paging PDSCH. The data transmission is included in the paging message, and a separate transmission does not need to be performed. In this case, receiving the data transmission based on the paging message includes obtaining the data transmission from the paging message.

In some embodiments, the paging message includes an indication of whether or not the data transmission is larger than a predetermined threshold. If the data transmission is smaller than the predetermined threshold, then the data transmission is carried by the paging message, and step 1004 is omitted. If the data transmission is larger than the predetermined threshold, then the paging message is used to carry a resource assignment for the data transmission in step 1004. The data transmission is then received in a subsequent transmission in step 1006.

Either or both of the methods 900 and 1000 could be performed by a UE having a processor and a receiver. For example, the UE 110 could perform either or both of the methods 900 and 1000. The processor could configure the UE in an inactive state, including the RRC_INACTIVE state. Configuring the UE in an inactive state could include performing a suspend procedure to transition from a connected state to the inactive state, for example. The receiver of the UE could be used to receive DCI, paging messages, and/or other DL or SL transmissions. In some embodiments, the UE also has a transmitter to transmit data in an inactive state.

It should be appreciated that one or more steps of the embodiment methods provided herein may be performed by corresponding units or modules. For example, data may be transmitted by a transmitting unit or a transmitting module. Data may be received by a receiving unit or a receiving module. Data may be processed by a processing unit or a processing module. The respective units/modules may be hardware, software, or a combination thereof. For instance, one or more of the units/modules may be an integrated circuit, such as field programmable gate arrays (FPGAs) or application-specific integrated circuits (ASICs). It will be appreciated that where the modules are software, they may be retrieved by a processor, in whole or part as needed, individually or together for processing, in single or multiple instances as required, and that the modules themselves may include instructions for further deployment and instantiation.

Although a combination of features is shown in the illustrated embodiments, not all of them need to be combined to realize the benefits of various embodiments of this disclosure. In other words, a system or method designed according to an embodiment of this disclosure will not necessarily include all of the features shown in any one of the Figures or all of the portions schematically shown in the Figures. Moreover, selected features of one example embodiment may be combined with selected features of other example embodiments.

Although this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method comprising:
    receiving, by a user equipment (UE) in an inactive state, downlink control information (DCI) comprising:
        a cyclic redundancy check (CRC) scrambled by a radio network temporary identifier (RNTI) that is specific to a group of UEs, the group of UEs including the UE, and
        a resource assignment for a data transmission to the UE;
        wherein the resource assignment indicates that a unicast or multicast data transmission is scheduled; and
    receiving, by the UE in the inactive state, the data transmission on a physical shared channel.

2. The method of claim 1, wherein the DCI further comprises a short message.

3. The method of claim 1, wherein the DCI further comprises an indication of a hybrid automatic repeat request (HARQ) process associated with the data transmission.

4. The method of claim 1, wherein the DCI further comprises a measurement request.

5. The method of claim 1, wherein the RNTI is a first RNTI, the method further comprising:
    receiving, by the UE in the inactive state, further DCI comprising a further CRC scrambled by a paging RNTI different from the first RNTI,
    wherein the DCI is size-matched with the further DCI.

6. The method of claim 1, wherein the RNTI is specific to the inactive state.

7. The method of claim 1, wherein the RNTI is specific to the UE.

8. The method of claim 7, wherein the RNTI is based on another identifier that is specific to the UE.

9. The method of claim 1, wherein the physical shared channel is a physical downlink shared channel or a physical sidelink shared channel.

10. The method of claim 1, wherein the resource assignment comprises at least one of: a frequency domain resource assignment, a time domain resource assignment, a virtual resource block to physical resource bock mapping, a modulation and coding scheme, and a transport block scaling factor.

11. A user equipment (UE) comprising:
    a processor to configure the UE in an inactive state; and
    a receiver to receive downlink control information (DCI) while the UE is in the inactive state and to receive a data transmission on a physical shared channel while the UE is in the inactive state, the DCI comprising:
        a cyclic redundancy check (CRC) scrambled by a radio network temporary identifier (RNTI) that is specific to a group of UEs, the group of UEs including the UE; and
        a resource assignment for the data transmission;
        wherein the resource assignment indicates that a unicast or multicast data transmission is scheduled.

12. The UE of claim 11, wherein the DCI further comprises a short message.

13. The UE of claim 11, wherein the DCI further comprises an indication of a hybrid automatic repeat request (HARQ) process associated with the data transmission.

14. The UE of claim 11, wherein the DCI further comprises a measurement request.

15. The UE of claim 11, wherein the RNTI is a first RNTI, wherein the receiver is further configured to:
   receive further DCI comprising a further CRC scrambled by a paging RNTI different from the first RNTI,
   wherein the DCI is size-matched with the further DCI.

16. The UE of claim 11, wherein the RNTI is specific to the inactive state.

17. The UE of claim 11, wherein the RNTI is specific to the UE.

18. The UE of claim 17, wherein the RNTI is based on another identifier that is specific to the UE.

19. The UE of claim 11, wherein the physical shared channel is a physical downlink shared channel or a physical sidelink shared channel.

20. The UE of claim 11, wherein the resource assignment comprises at least one of: a frequency domain resource assignment, a time domain resource assignment, a virtual resource block to physical resource bock mapping, a modulation and coding scheme, and a transport block scaling factor.

* * * * *

UNITED STATES PATENT AND TRADEMARK OFFICE
CERTIFICATE OF CORRECTION

PATENT NO. : 11,832,274 B2
APPLICATION NO. : 17/668765
DATED : November 28, 2023
INVENTOR(S) : Javad Abdoli et al.

It is certified that error appears in the above-identified patent and that said Letters Patent is hereby corrected as shown below:

In the Specification

In the Description:

At Column 2, Line 28:
"physical resource bock mapping, a modulation and coding"

Should read:
-- physical resource block mapping, a modulation and coding --

At Column 3, Line 1:
"physical resource bock mapping, a modulation and coding"

Should read:
-- physical resource block mapping, a modulation and coding --

At Column 28, Line 11:
"…ment, a virtual resource block to physical resource bock"

Should read:
--…ment, a virtual resource block to physical resource block --

In the Claims

At Column 30, Claim 10, Line 52:
"resource block to physical resource bock mapping, a modu-…"

Should read:
-- resource block to physical resource block mapping, a modu-… --

Signed and Sealed this
Sixteenth Day of July, 2024

*Katherine Kelly Vidal*

Katherine Kelly Vidal
*Director of the United States Patent and Trademark Office*

CERTIFICATE OF CORRECTION (continued)
U.S. Pat. No. 11,832,274 B2

At Column 31, Claim 20, Line 25:
"resource block to physical resource bock mapping, a modu-…"

Should read:
-- resource block to physical resource block mapping, a modu-… --